United States Patent
Jung et al.

(10) Patent No.: US 12,124,730 B2
(45) Date of Patent: Oct. 22, 2024

(54) ELECTRONIC DEVICE, METHOD, NON-TRANSITORY COMPUTER-READABLE STORAGE MEDIA, AND UFS CARD INCLUDING UFS STORAGE DEVICE

(71) Applicant: SAMSUNG ELECTRONICS CO., LTD., Suwon-si (KR)

(72) Inventors: Wonsuk Jung, Suwon-si (KR); Taeyoung Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 155 days.

(21) Appl. No.: 17/863,401

(22) Filed: Jul. 13, 2022

(65) Prior Publication Data
US 2023/0125869 A1   Apr. 27, 2023

Related U.S. Application Data

(63) Continuation of application No. PCT/KR2022/009150, filed on Jun. 27, 2022.

(30) Foreign Application Priority Data

Oct. 25, 2021 (KR) .......... 10-2021-0142966
Nov. 24, 2021 (KR) .......... 10-2021-0163689

(51) Int. Cl.
   *G06F 3/06* (2006.01)
(52) U.S. Cl.
   CPC .......... *G06F 3/0655* (2013.01); *G06F 3/0604* (2013.01); *G06F 3/0679* (2013.01)
(58) Field of Classification Search
   CPC .... G06F 3/0655; G06F 3/0604; G06F 3/0679; G06F 1/206; G06F 1/3225; G06F 1/3275;
   (Continued)

(56) References Cited

U.S. PATENT DOCUMENTS 8,054,686 B2   11/2011   Yeh et al.
9,355,024 B2 *  5/2016   Nguyen .................. G06F 1/206
(Continued)

FOREIGN PATENT DOCUMENTS

KR   20190008679 A   1/2019
KR   20190011654 A   2/2019
KR   20200126533 A   11/2020

OTHER PUBLICATIONS

International Search Report mailed Sep. 29, 2022 for PCT/KR2022/009150, citing the above reference(s).

*Primary Examiner* — Francisco A Grullon
(74) *Attorney, Agent, or Firm* — CANTOR COLBURN LLP

(57) ABSTRACT

An electronic device includes at least one processor, a Universal Flash Storage (UFS) device controller operatively coupled with the at least one processor, a UFS interface including a plurality of downstream lanes for transmitting data and a plurality of upstream lanes for transmitting data and storage including a cache memory and a plurality of non-volatile memories. The at least one processor transmits a first control signal to instruct measuring a temperature of the storage and identifying of the measured temperature exceeding a threshold value to the UFS device controller, receives a status signal indicating that the measured temperature exceeds the threshold value from the UFS device controller, and based on the status signal, transmits, to the UFS device controller, a second control signal to instruct that deactivating at least some of the plurality of downstream lanes and upstream lanes, or deactivating the cache memory in the storage.

20 Claims, 20 Drawing Sheets

(58) Field of Classification Search
CPC ..... G06F 2212/1024; G06F 2212/1028; G06F 2212/502; G06F 12/0866; G06F 12/0888; G06F 2212/214; G06F 2212/261; G06F 2212/313; G11C 2207/2227; G11C 7/04; Y02D 10/00
See application file for complete search history.

(56) References Cited

U.S. PATENT DOCUMENTS

| | | |
|---|---|---|
| 10,175,667 B2 | 1/2019 | Bang et al. |
| 10,318,211 B2 | 6/2019 | Kim |
| 10,790,032 B2 | 9/2020 | Blodgett et al. |
| 11,016,545 B2 | 5/2021 | Yang et al. |
| 11,029,888 B2 | 6/2021 | Kim |
| 2018/0203632 A1* | 7/2018 | Shih ................. G06F 3/0616 |
| 2020/0057580 A1* | 2/2020 | Kim .................. G11C 16/3418 |
| 2020/0142635 A1* | 5/2020 | Nguyen ............. G06F 3/0604 |
| 2020/0387126 A1 | 12/2020 | Yum et al. |
| 2021/0174877 A1 | 6/2021 | Luo et al. |
| 2022/0100247 A1* | 3/2022 | Garg ................. G06F 1/3203 |
| 2022/0252460 A1* | 8/2022 | Yeh ................... G11C 7/04 |
| 2022/0261326 A1* | 8/2022 | Byun ................. G06F 11/3485 |

\* cited by examiner

ELECTRONIC DEVICE, METHOD, NON-TRANSITORY COMPUTER-READABLE STORAGE MEDIA, AND UFS CARD INCLUDING UFS STORAGE DEVICE

CROSS-REFERENCE TO RELATED APPLICATION(S)

This application is a continuation of PCT International Application No. PCT/KR2022/009150, which was filed on Jun. 27, 2022, and claims priority to Korean Patent Application No. 10-2021-0142966, filed on Oct. 25, 2021, in the Korean Intellectual Property Office, and claims priority to Korean Patent Application No. 10-2021-0163689, filed on Nov. 24, 2021, in the Korean Intellectual Property Office, the disclosure of which are incorporated by reference herein their entirety.

BACKGROUND

Technical Field

A following descriptions relate to an electronic device, a method, a non-transitory computer-readable storage media, and an UFS card including a Universal Flash Storage (UFS) storage device.

Description of Related Art

A semiconductor memory device may be classified into a volatile memory device that loses stored data when power is supplied, and a non-volatile memory device that does not lose stored data. The volatile memory device has a fast reading and writing speed, but when external power supply is cut off, stored content may be lost. On the other hand, although the read/write speed of a non-volatile memory device is slower than that of the volatile memory device, a content may be preserved even when the external power supply is interrupted.

In particular, the non-volatile memory such as a flash memory may be widely used as a storage device in various fields due to advantages such as large capacity, low noise, and low power. In particular, a solid state drive (SSD) implemented based on the flash memory may be used as a mass storage devices in various devices such as personal computers, laptops, workstations, and server systems.

SUMMARY

Universal flash storage (UFS) defines with respect to Temperature Event Notification in the standard. Because it is extremely rare for UFS storage devices to go outside a temperature range that guarantees normal operation, there is no function within the UFS standard (published by JEDEC) to correspond to temperature event notification.

However, in the future when the data rate is expected to double, UFS storage devices are expected to be outside the temperature range that guarantees normal operation. Accordingly, in order to ensure the temperature range that guarantees normal operation, a method of emitting a temperature of a package including the UFS storage device in hardware is considered, but the effect is not guaranteed. Therefore, an additional method for ensuring the temperature range that guarantees the normal operation of the UFS storage device is desirable.

The technical problems to be achieved in this document are not limited to those described above, and other technical problems not mentioned herein will be clearly understood by those having ordinary knowledge in the art to which the present disclosure belongs, from the following description.

According to an embodiment, an electronic device may comprise at least one processor, a Universal Flash Storage (UFS) device controller operatively coupled with the at least one processor, a UFS interface including a plurality of downstream lanes for transmitting data from the at least one processor to the UFS device controller, and a plurality of upstream lanes for transmitting data from the UFS device controller to the at least one processor, and storage including a cache memory and a plurality of non-volatile memories and. The at least one processor may transmit, in response to booting up of the at least one processor, a first control signal to instruct measuring a temperature of the storage using a temperature sensor operatively coupled to the UFS device controller, and identifying of the measured temperature exceeding a threshold value to the UFS device controller. The at least one processor may receive a status signal indicating that the temperature of the storage measured by the temperature sensor exceeds the threshold value from the UFS device controller. The at least one processor may transmit, based on the status signal, to the UFS device controller, a second control signal to instruct inactivating at least some of the plurality of downstream lanes and the plurality of upstream lanes, or deactivating the cache memory which stores 1 bit per unit cell in the storage.

According to an embodiment, an electronic device may comprise at least one processor, a Universal Flash Storage (UFS) device controller operatively coupled with the at least one processor, a UFS interface including a plurality of downstream lanes for transmitting data from the at least one processor to the UFS device controller, and a plurality of upstream lanes for transmitting data from the UFS device controller to the at least one processor and a storage including a cache memory and a plurality of non-volatile memories. The at least one processor may be configured to transmit, to the UFS device controller, a first control signal instructing to identify that a measured temperature of the storage is less than a threshold value by using a temperature sensor operatively coupled to the UFS device controller. The at least one processor may receive, from the UFS device controller, a status signal indicating that the temperature of the storage measured by the temperature sensor is less than the threshold value. The at least one processor may transmit, based on the status signal, to the UFS device controller, a second control signal to instruct activating the deactivated lanes among the plurality of downstream lanes and the plurality of upstream lanes, and activating the cache memory which stores 1 bit per unit cell in the storage.

According to an embodiment, an electronic device may comprise at least one processor, a Universal Flash Storage (UFS) device controller operatively coupled with the at least one processor, a UFS interface including a plurality of downstream lanes for transmitting data from the at least one processor to the UFS device controller, and a plurality of upstream lanes for transmitting data from the UFS device controller to the at least one processor and a storage including a cache memory and a plurality of non-volatile memories. The at least one processor may be configured to transmit, in response to booting up of the at least one processor, to the UFS device controller, a first control signal instructing to identifying that a measured temperature of the storage is greater than a first threshold value by using a temperature sensor operatively coupled to the UFS device controller or to identifying that the measured temperature of the storage is less than a second threshold value which is less than the first threshold value. The at least one processor may be configured to transmit, in response to receiving, from the UFS device controller, a status signal indicating that the measured temperature of the storage exceeds the first threshold value, to the UFS device controller, a second control signal instructing a plurality of first events to reduce a current consumption of the UFS device controller. The at least one processor may be configured to transmit, in response to receiving, from the UFS device controller, the status signal indicating that the measured temperature of the storage is less than the second threshold value, to the UFS device controller, the second control signal instructing a plurality of second events to increase a current consumption of the UFS device controller.

According to an embodiment, a method of operating the electronic device including at least one processor; a Universal Flash Storage (UFS) device controller operatively coupled with the at least one processor; a UFS interface including a plurality of downstream lanes for transmitting data from the at least one processor to the UFS device controller, and a plurality of upstream lanes for transmitting data from the UFS device controller to the at least one processor; and storage including a plurality of non-volatile memories and a cache memory may include transmitting, in response to booting up of the at least one processor, to the UFS device controller, a first control signal to instruct that measuring a temperature of the storage using a temperature sensor operatively coupled to the UFS device controller, and identifying of the measured temperature exceeding a threshold value; receiving from the UFS device controller, a status signal indicating that the measured temperature of the storage through the temperature sensor exceeds the threshold value; and based on the status signal, transmitting, to the UFS device controller, a second control signal to instruct that deactivating at least some of the plurality of downstream lanes and at least some of the plurality of upstream lanes, and deactivating the cache memory which stores 1 bit per unit cell in the storage. According to an embodiment, a method of operating the electronic device including at least one processor; a Universal Flash Storage (UFS) device controller operatively coupled with the at least one processor; a UFS interface including a plurality of downstream lanes for transmitting data from the at least one processor to the UFS device controller, and a plurality of upstream lanes for transmitting data from the UFS device controller to the at least one processor; and storage including a plurality of non-volatile memories and a cache memory may include transmitting, in response to booting up of the at least one processor, to the UFS device controller, a first control signal instructing to identifying that a measured temperature of the storage is less than a threshold value by using a temperature sensor operatively coupled to the UFS device controller; receiving, from the UFS device controller, a status signal indicating that the measured temperature of the storage through the temperature sensor is less than the threshold value; and based on the status signal, transmit, to the UFS device controller, a second control signal to instruct that activating the deactivated lanes among the plurality of downstream lanes and the plurality of upstream lanes, and activating the cache memory which stores 1 bit per unit cell in the storage.

According to an embodiment, a method of operating the electronic device including at least one processor; a Universal Flash Storage (UFS) device controller operatively coupled with the at least one processor; a UFS interface including a plurality of downstream lanes for transmitting data from the at least one processor to the UFS device controller, and a plurality of upstream lanes for transmitting data from the UFS device controller to the at least one processor; and storage including a plurality of non-volatile memories and a cache memory may include transmitting, in response to booting up of the at least one processor, to the UFS device controller, a first control signal instructing to identifying that a measured temperature of the storage is greater than a first threshold value by using a temperature sensor operatively coupled to the UFS device controller or to identifying that the measured temperature of the storage is less than a second threshold value which is less than the first threshold value; in response to receiving, from the UFS device controller, a status signal indicating that the measured temperature of the storage exceeds the first threshold value, transmitting, to the UFS device controller, a second control signal instructing a plurality of first events to reduce a current consumption of the UFS device controller, and in response to receiving, from the UFS device controller, the status signal indicating that the measured temperature of the storage is less than the second threshold value, transmitting, to the UFS device controller, the second control signal instructing a plurality of second events to increase a current consumption of the UFS device controller.

According to an embodiment, a non-transitory computer readable storage medium may store one or more programs including instructions which, when executed by at least one processor of an electronic device including at least one processor; a Universal Flash Storage (UFS) device controller operatively coupled with the at least one processor; a UFS interface including a plurality of downstream lanes for transmitting data from the at least one processor to the UFS device controller; and a plurality of upstream lanes for transmitting data from the UFS device controller to the at least one processor; and storage including a plurality of non-volatile memories and a cache memory, cause the electronic device to transmit, in response to booting up of the at least one processor, to the UFS device controller, a first control signal to instruct that measuring a temperature of the storage using a temperature sensor operatively coupled to the UFS device controller, and identifying of the measured temperature exceeding a threshold value; receive, from the UFS device controller, a status signal indicating that the measured temperature of the storage through the temperature sensor exceeds the threshold value; and based on the status signal, transmit, to the UFS device controller, a second control signal to instruct that deactivating at least some of the plurality of downstream lanes and at least some of the plurality of upstream lanes, and deactivating the cache memory which stores 1 bit per unit cell in the storage.

According to an embodiment, a non-transitory computer readable storage medium may store one or more programs including instructions which, when executed by at least one processor of an electronic device including at least one processor; a Universal Flash Storage (UFS) device controller operatively coupled with the at least one processor; a UFS interface including a plurality of downstream lanes for transmitting data from the at least one processor to the UFS device controller; and a plurality of upstream lanes for transmitting data from the UFS device controller to the at least one processor; and storage including a plurality of non-volatile memories and a cache memory, cause the electronic device to transmit, in response to booting up of the at least one processor, to the UFS device controller, a first control signal instructing to identifying that a measured temperature of the storage is less than a threshold value by using a temperature sensor operatively coupled to the UFS device controller; receive, from the UFS device controller, a status signal indicating that the measured temperature of the storage through the temperature sensor is less than the threshold value; and based on the status signal, transmit, to the UFS device controller, a second control signal to instruct that activating the deactivated lanes among the plurality of downstream lanes and the plurality of upstream lanes, and activating the cache memory which stores 1 bit per unit cell in the storage.

According to an embodiment, a non-transitory computer readable storage medium may store one or more programs including instructions which, when executed by at least one processor of an electronic device including at least one processor; a Universal Flash Storage (UFS) device controller operatively coupled with the at least one processor; a UFS interface including a plurality of downstream lanes for transmitting data from the at least one processor to the UFS device controller; and a plurality of upstream lanes for transmitting data from the UFS device controller to the at least one processor; and storage including a plurality of non-volatile memories and a cache memory, cause the electronic device to transmit, in response to booting up of the at least one processor, to the UFS device controller, a first control signal instructing to identifying that a measured temperature of the storage is greater than a first threshold value by using a temperature sensor operatively coupled to the UFS device controller or to identifying that the measured temperature of the storage is less than a second threshold value which is less than the first threshold value; in response to receiving, from the UFS device controller, a status signal indicating that the measured temperature of the storage exceeds the first threshold value, transmitting, to the UFS device controller, a second control signal instructing a plurality of first events to reduce a current consumption of the UFS device controller; and in response to receiving, from the UFS device controller, the status signal indicating that the measured temperature of the storage is less than the second threshold value, transmit, to the UFS device controller, the second control signal instructing a plurality of second events to increase a current consumption of the UFS device controller.

DETAILED DESCRIPTION

According to an embodiment, electronic devices, methods, computer-readable storage media, and UFS (Universal Flash Storage) cards including UFS storage devices can change, when UFS storage devices operate in a specific temperature range, the amount of current consumption to return the temperature of the UFS storage devices to a temperature range in which reliability is guaranteed.

Figure 1:
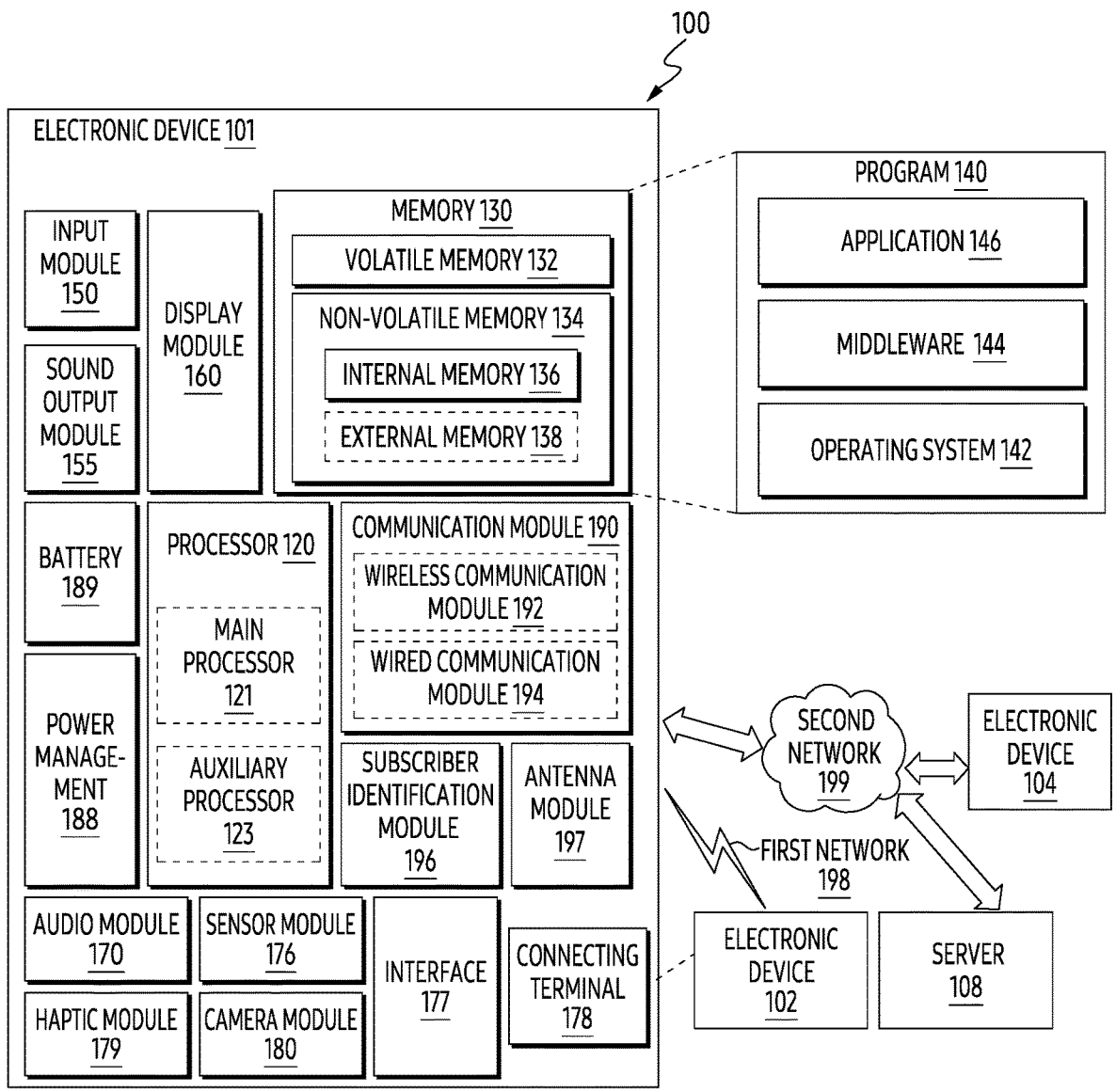
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101.

The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
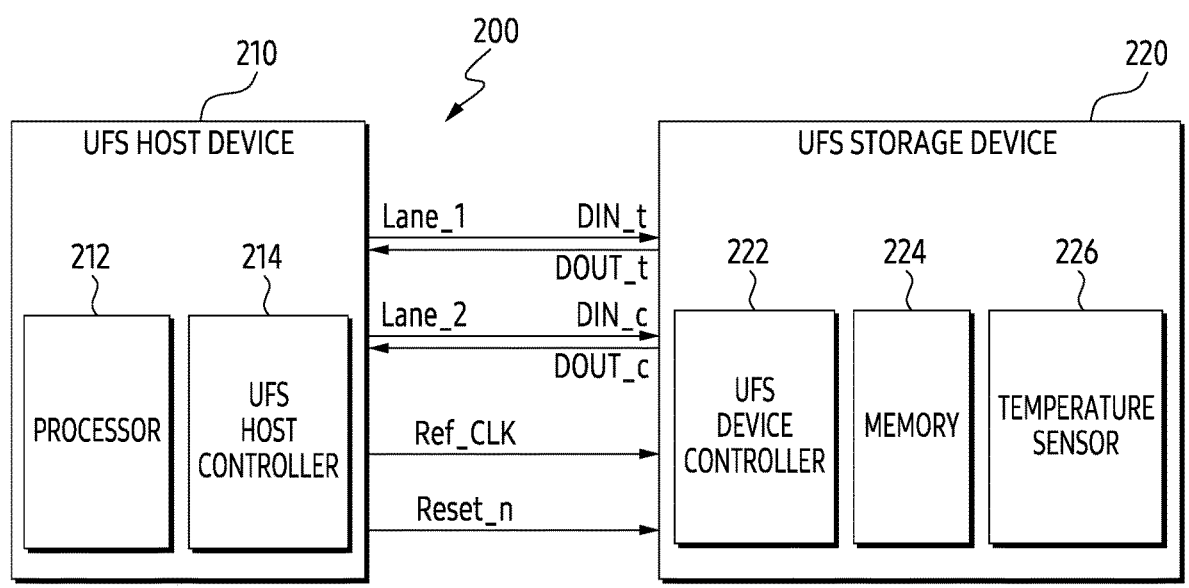
FIG. 2A illustrates a UFS system including a UFS host device and a UFS storage device according to various embodiments.

FIG. 2A illustrates a UFS system 200 including a UFS host device 210 and a UFS storage device 220 according to various embodiments.

Referring to FIG. 2A, the UFS system 200 is a system according to a UFS standard announced by the Joint Electron Device Engineering Council (JEDEC) and may include the UFS host device 210 and the UFS storage device 220. Referring to FIGS. 1 and 2A together, the UFS host device 210 may be implemented as a part of the processor 120 of FIG. 1, or the UFS storage device 220 may be implemented as a part of a memory 130 (e.g., the non-volatile memory 134) of FIG. 1.

According to an embodiment, the UFS host device 210 and the UFS storage device 220 may be connected to each other through a UFS interface. The UFS interface may include a lane for transmitting a reference clock (Ref_CLK), a lane for transmitting a hardware reset signal (Reset_n) for the UFS storage device 220, lanes for transmitting a differential input signal pair (DIN_t, DIN_c) and lanes for transmitting a differential output signal pair (DOUT_t, DOUT_c). The differential input signal pair (DIN_t, DIN_c) that transmit data from the UFS host device 210 to the UFS storage device 220 may be referred to as a "downstream lane". The differential output signal pair (DOUT_t, DOUT_c) that transmit data from the UFS storage device 220 to the UFS host device 210 may be referred to as an "upstream lane".

According to embodiments, the UFS host device 210 may include a processor 212 and a UFS host controller 214. The processor 212 of the UFS host device 210 may correspond to the main processor 121 (e.g., an application processor) of FIG. 1. The processor 212 may execute a program (or software) desired to communicate with the UFS storage device 220. The processor 212 may control the UFS host controller 214 through a host controller interface (UFS-HCI). For example, the input/output request of the processor 212 may be converted into a UFS commands specified in the UFS standard through a UFS driver (not shown), and the converted UFS commands may be transmitted to the UFS host controller 214. The UFS host controller 214 may transmit the converted UFS commands to the UFS storage device 220 through the UFS interface.

According to embodiments, the UFS storage device 220 may include a UFS device controller 222, a memory 224, and a temperature sensor 226.

The UFS device controller 222 may receive a command from the UFS host device 210 and provide the command to the UFS host device 210 by reading the user data from the memory 224 according to the received command, or program the user data provided from the UFS host device 210 in the memory 224.

According to various embodiments, the UFS device controller 222 may receive a temperature sensing value from the temperature sensor 226. The UFS device controller 222 may determine an internal temperature of the UFS storage device 220 (more specifically, the memory 224) based on the received temperature sensing value. The UFS device controller 222 may transmit a status signal indicating a comparison result to the UFS host device 210, where the comparison result is a result obtained by comparing the determined internal temperature with a predefined threshold temperature. Alternatively, the UFS device controller 222 may include the determined internal temperature value in a measurement signal and transmit it to the UFS host device 210.

The memory 224 may be a non-volatile storage device that stores data regardless of whether power is supplied. The memory 224 may include non-volatile memories that store data under the control of the UFS device controller 222. For example, the nonvolatile memory may include a NAND flash memory, but is not limited thereto. According to various embodiments, the memory 224 may include other types of nonvolatile memory such as a phase-change random access memory (PRAM) and/or a resistive random access memory (RRAM).

According to an embodiment, the temperature sensor 226 may sense a temperature of the UFS storage device 220. For example, the temperature sensor 226 may be a sensor for sensing a temperature (e.g., an internal temperature, a surface temperature) of the UFS storage device 220. For example, the temperature sensor 226 may sense a temperature of the memory 224 included in the UFS storage device 220. The temperature sensor 226 may sense the temperature of the UFS storage device 220 (more specifically, the memory 224) during a predefined period and transmit the sensed temperature value to the UFS device controller 222. In the above-described embodiment, the temperature sensor 226 has been described as a single sensor, but is not limited thereto. According to various embodiments, the temperature sensor 226 may include a plurality of temperature sensors (not shown) for sensed the temperature of the UFS storage device 220. In this case, the UFS device controller 222 may average the temperature sensing values received from the plurality of temperature sensors (not shown) to identify the internal temperature of the UFS storage device 220.

Figure 2B:
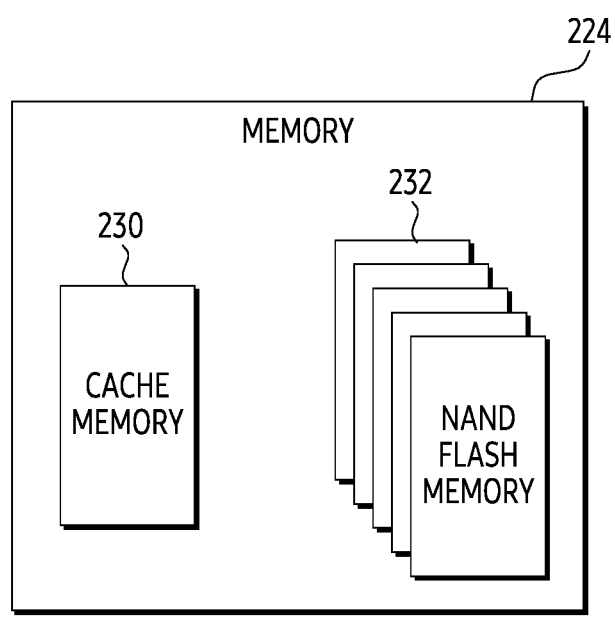
FIG. 2B illustrates a block diagram of a storage according to various embodiments.

FIG. 2B illustrates a block diagram of a memory 224 according to various embodiments.

Referring to FIG. 2B, the memory 224 may include a cache memory 230 and a plurality of NAND flash memories 232.

The cache memory 230 may temporarily store write-data received from the UFS host device 210. The cache memory 230 may be a buffer memory for write-boost defined in the UFS standard. For example, the cache memory 230 may correspond to a single level cell (SLC) flash memory. The SLC flash memory may be a flash memory configured to store 1 bit per each unit cell.

The plurality of NAND flash memories 232 are non-volatile storage devices that store data even when power supply is cut off, and may have a relatively large storage capacity compared to cache memory 230. The plurality of NAND flash memories 232 may be flash memories configured to store at least 2 bits per each unit cell. For example, the plurality of NAND flash memories 232 may correspond to any one of a multi-level cell (MLC), a triple level cell (TLC), and a quadruple level cell (QLC).

According to various embodiments, the cache memory 230 may be activated or deactivated under the control of the UFS device controller 222. For example, the UFS device controller 222 may activate the cache memory 230 in response to receiving a control signal for increasing current consumption of the UFS device controller 222 from the UFS host device 210. The control signal for decreasing the current consumption may be generated in response to identifying that the internal temperature of the UFS storage device 220 (more specifically, the memory 224) is greater than a predefined threshold temperature. For another example, the UFS device controller 222 may deactivate the cache memory 230 in response to receiving a control signal for reducing the current consumption of the UFS device controller 222 from the UFS host device 210. The control signal for increasing the current consumption may be generated in response to identifying that the internal temperature of the UFS storage device 220 is less than a predefined threshold temperature. As used herein, the "current consumption" may be defined as a total current consumed by a target object.

Figure 3:
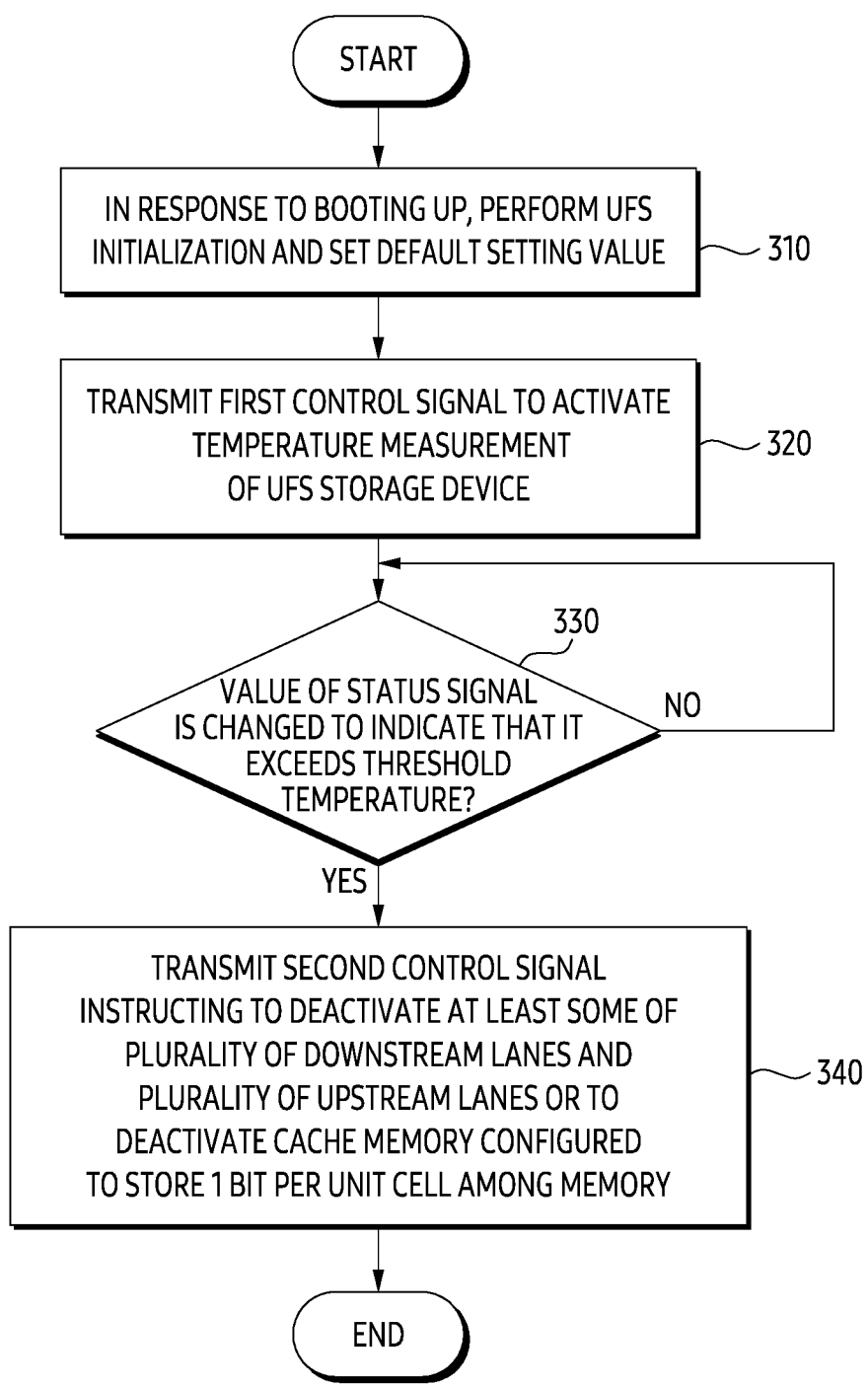
FIG. 3 is a flowchart illustrating an operation of an electronic device when a temperature of a UFS storage device is greater than a threshold temperature, according to various embodiments.

FIG. 3 is a flowchart illustrating an operation of an electronic device when a temperature of a UFS storage device is greater than a threshold temperature, according to various embodiments.

Referring to FIG. 3, in operation 310, the electronic device 101 (e.g., the processor 120 of FIG. 1) may perform a UFS initialization and may set a default setting value in response to boot up. The boot up may refer to a user's turning on the electronic device 101 to load the operating system 142 stored in the memory 130. In response to the boot up, the electronic device 101 may determine a UFS initialization and a default setting value. The UFS initialization may refer to supplying power to the UFS storage device 220. The default setting value is a value transmitted to the UFS device controller 222 and may include at least one of a frequency of a reference clock (Ref_CLK) for transmitting and receiving data to and from the UFS host device 210, and a value indicating an activated lane among a first lane Lane_1 and a second lane_2 of the UFS interface.

In operation 320, the electronic device 101 (e.g., the processor 120 of FIG. 1) may transmit a first control signal for activating temperature measurement of the UFS storage device 220. In an embodiment, for example, by transmitting the first control signal to the UFS storage device 220, the UFS host device 210 may control the UFS storage device 220 to measure the internal temperature of the memory 224 using the temperature sensor 226. According to an embodiment, the first control signal may include a "wExceptionEventControl" attribute. For example, when bit 3 of the "wExceptionEventControl" attribute is "Logic High" or "1", "TOO_HIGH_TEMP_EN" may be activated. The term "TOO_HIGH_TEMP_EN" may refer to activation of an event for monitoring whether the internal temperature of the UFS storage device 220 (more specifically, the memory 224) is high temperature. When bit 3 of the "wExceptionEventControl" attribute is "Logic High" or "1" by decoding the first control signal received from the UFS host device 210, the UFS storage device 220 may activate the temperature sensor 226.

In operation 330, the electronic device 101 may identify whether the value of the status signal is changed to indicate that it exceeds threshold temperature. The UFS device controller 222 may identify whether the temperature value sensed through the temperature sensor 226 exceeds the threshold temperature. The threshold temperature may be an upper limit value of a predefined temperature. In an embodiment, for example, the UFS storage device 220 may be required to operate within the predefined temperature range to ensure reliability of data stored in the memory 224. The predefined temperature range may be −20 degrees in Celsius (° C.) to 85° C., and the threshold temperature (the upper limit) may correspond to 85° C. The UFS device controller 222 may transmit a status signal including a comparison result between a temperature sensed through the temperature sensor 226 and the threshold temperature to the UFS host device 210 at every predefined periods. In an embodiment, the status signal may include a "wExceptionEventStatus" attribute. The UFS device controller 222 may indicate a comparison result between the temperature sensed through the temperature sensor 226 and the threshold temperature through bit 3 of "wExceptionEventStatus". For example, when the temperature sensed through the temperature sensor 226 is lower than the threshold temperature, the UFS device controller 222 may transmit a status signal including bit 3 of "wExceptionEventStatus" of "logic low" or "0" to the UFS host device 210. For another example, when the temperature sensed through the temperature sensor 226 is higher than the threshold temperature, the UFS device controller 222 may transmit a status signal including bit 3 of "wExceptionEventStatus" of "logic high" or "1" to the UFS host device 210.

The UFS host device 210 may identify whether the internal temperature of the UFS storage device 220 (more specifically, the memory 224) exceeds the threshold temperature by receiving the status signal from the UFS device controller 222 and checking bit 3 of the "wExceptionEventStatus" attribute. According to an embodiment, when the internal temperature of the UFS storage device 220 does not exceed the threshold temperature, operation 330 may be repeated until it is changed to indicate that the value of the status signal exceeds the threshold temperature.

In operation 340, the electronic device 101 (e.g., the processor 120 of FIG. 1) may transmit the second control signal instructing to deactivate at least some of the plurality of downstream lanes and the plurality of upstream lanes, or to deactivate the cache memory 230 configured to store 1 bit per unit cell among the memory 224 to the UFS device controller 222.

When indicating that the "wExceptionEventStatus" attribute of the status signal exceeds a threshold temperature, the electronic device 101 may control the UFS storage device 220 to reduce the temperature of the UFS storage device 220 (more specifically, the memory 224). The electronic device 101 may lower the temperature of the UFS storage device 220 by reducing the consumption current of the UFS storage device 220 to control the UFS storage device 220 to operate in the predefined temperature range.

According to an embodiment, the UFS device controller 222 may deactivate at least some of a plurality of downstream lanes and a plurality of upstream lanes based on the second control signal. For example, the UFS device controller 222 may deactivate at least one of the first lane (Lane_1) and the second lane (Lane_2). When at least one of the first lane Lane_1 and the second lane Lane_2 is deactivated, the current consumption of the UFS storage device 220 (more specifically, UFS device controller 222) may be reduced, and the temperature of the UFS storage device 220 may also be reduced based on the reduction of the current consumption.

According to another embodiment, the UFS device controller 222 may deactivate the cache memory 230 configured to store 1 bit per unit cell of the memory 224 based on the second control signal. The cache memory 230 may be a buffer memory for improving a write operation to the plurality of NAND flash memories 232. The UFS device controller 222 may deactivate the cache memory 230 to reduce amount of the current consumption of the UFS storage device 220.

In the above-described embodiment, the cache memory 230 is described based on an implementation separately from the plurality of NAND flash memories 232, but is not limited thereto. According to various embodiments, the UFS device controller 222 may perform SLC caching for write-acceleration by controlling at least partial area of the plurality of NAND flash memories 232 to store 1 bit per unit cell. In this case, the UFS device controller 222 may reduce the temperature of the UFS storage device 220 by not allocating the at least partial area for the SLC caching in response to the second control signal.

Figure 4:
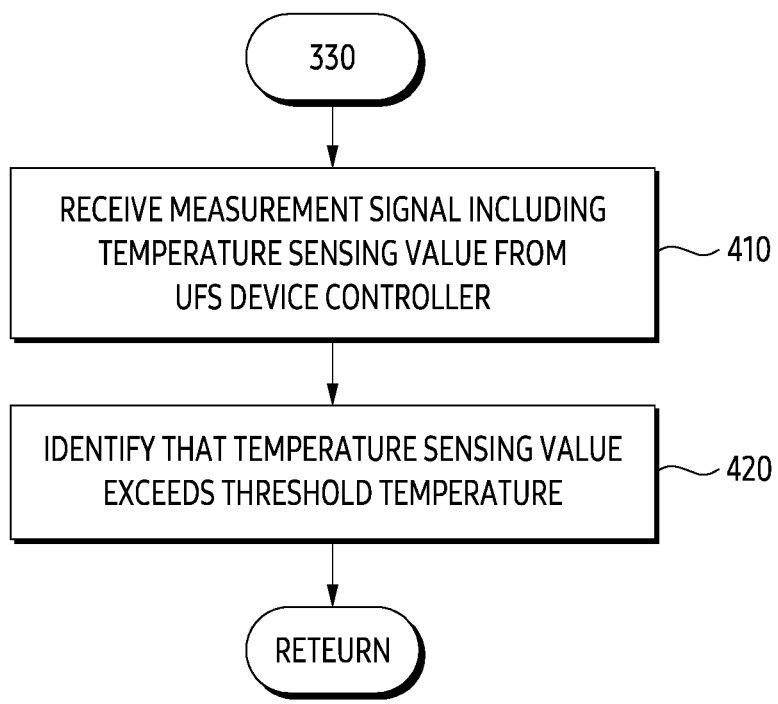
FIG. 4 is a flowchart illustrating an operation of an electronic device for measuring a temperature of a UFS storage device, according to various embodiments.

FIG. 4 is a flowchart illustrating an operation of an electronic device 101 for measuring a temperature of a UFS storage device according to various embodiments.

Referring to FIG. 4, in operation 410, the electronic device 101 (e.g., the processor 120 of FIG. 1) may receive a measurement signal including a temperature sensing value from the UFS device controller 222. In an embodiment, the measurement signal may include a "bDeviceCaseRoughTemperature" attribute. The "bDeviceCaseRoughTemperature" attribute may directly include a value sensed by the internal temperature of the UFS storage device 220 (more specifically, the memory 224). In an embodiment, for example, the "bDeviceCaseRoughTemperature" property may include a sensing value of −79° C. to 170° C. Based on the status signal including the "wExceptionEventStatus" attribute, the UFS host device 210 may only identify that the internal temperature of the UFS storage device 220 exceeds the threshold temperature, whereas based on the "bDeviceCaseRoughTemperature" attribute, the UFS host device 210 may also identify a specific internal temperature of the UFS storage device 220.

In operation 420, the electronic device 101 may identify that the temperature sensing value exceeds the threshold temperature. The UFS host device 210 may identify whether the temperature sensing value exceeds the threshold temperature by comparing the threshold temperature with the internal temperature of the UFS storage device 220 (more specifically, the memory 224) identified based on the "bDeviceCaseRoughTemperature" attribute included in the measurement signal. The UFS host device 210 may transmit the second control signal of operation 340 to the UFS storage device 220 based on the identification.

FIGS. 5A to 5E are flowcharts each illustrating operations of an electronic device 101 when a temperature of a UFS storage device 220 according to various embodiments is greater than a threshold temperature.

Referring to FIGS. 5A to 5E, operations 510 to 530 may correspond to operations 310 to 330 illustrated in FIG. 3.

Figure 5A:
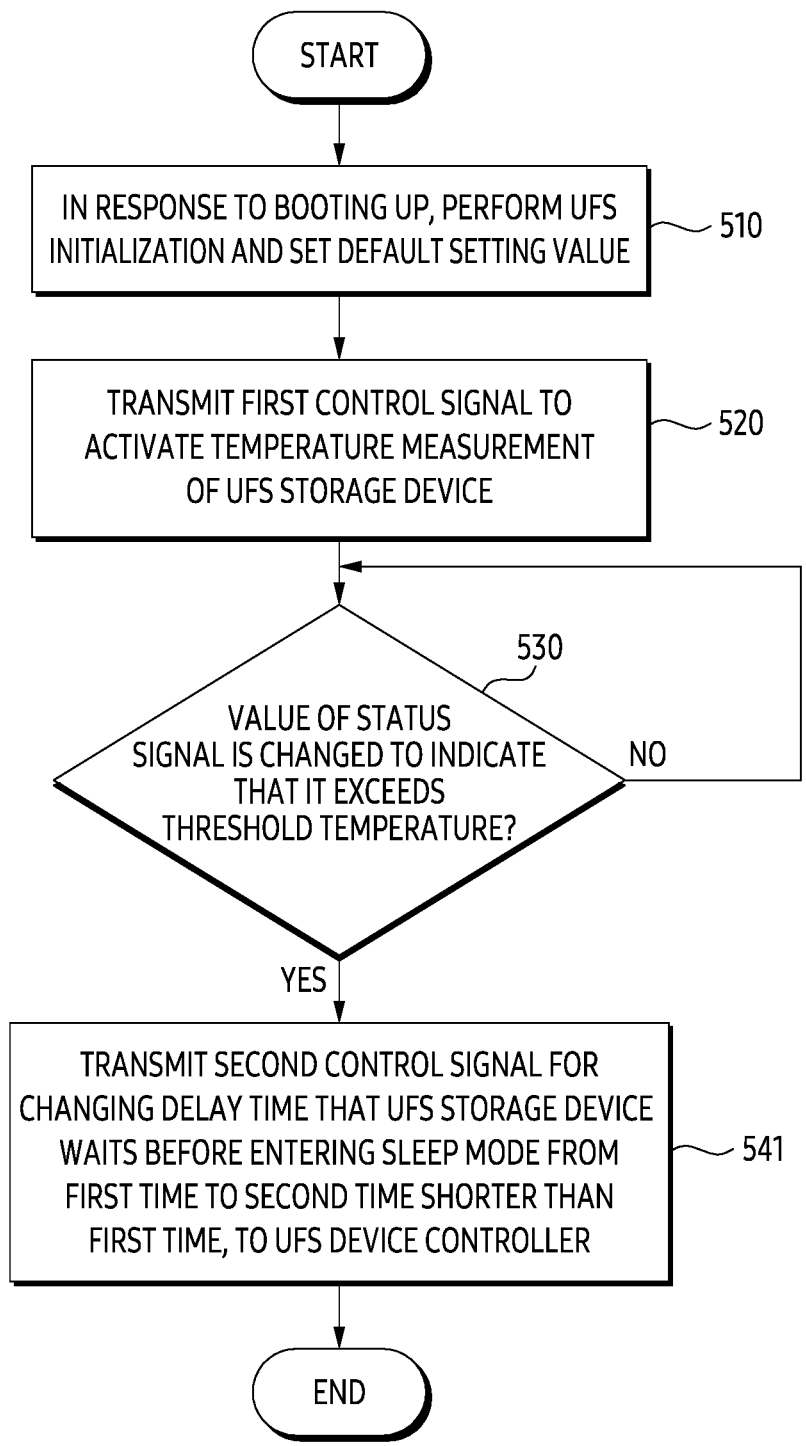
FIGS. 5A to 5E are flowcharts each illustrating operations of an electronic device when a temperature of a UFS storage device according to various embodiments is greater than a threshold temperature.

Referring to FIG. 5A, in operation 541, the electronic device 101 (e.g., the processor 120 of FIG. 1) may transmit a second control signal for changing a delay time that the UFS storage device 220 waits before entering the sleep mode from a first time to a second time shorter than the first time to the UFS device controller 222. In operation 530, the UFS host device 210 may generate the second control signal in response to identifying that the temperature of the UFS storage device 220 (more specifically, the memory 224) exceeds the threshold temperature based on the status signal. When a new data input/output request is not input during the delay time from the time when data input/output is terminated between the UFS storage device 220 and the UFS host device 210, the sleep mode may be a mode in which the UFS storage device 220 is changed to an inactive state to reduce power consumption of the electronic device 101. For example, the UFS host device 210 may control the UFS storage device 220 to enter the sleep mode faster by changing the length of the time the UFS storage device 220 waits from the first time to the second time shorter than the first time using the second control signal. As the time for the UFS storage device 220 to enter the sleep mode is shortened, amount of the current consumption of the UFS storage device 220 (more specifically, UFS device controller 222) may also be reduced, and the internal temperature of the UFS storage device 220 (more specifically, the memory 224) may also be reduced. The delay time is a host trigger signal and may be set to various time periods according to a manufacturer. According to an embodiment, the second time may be the shortest time among time periods in which the delay time may have.

Figure 5B:
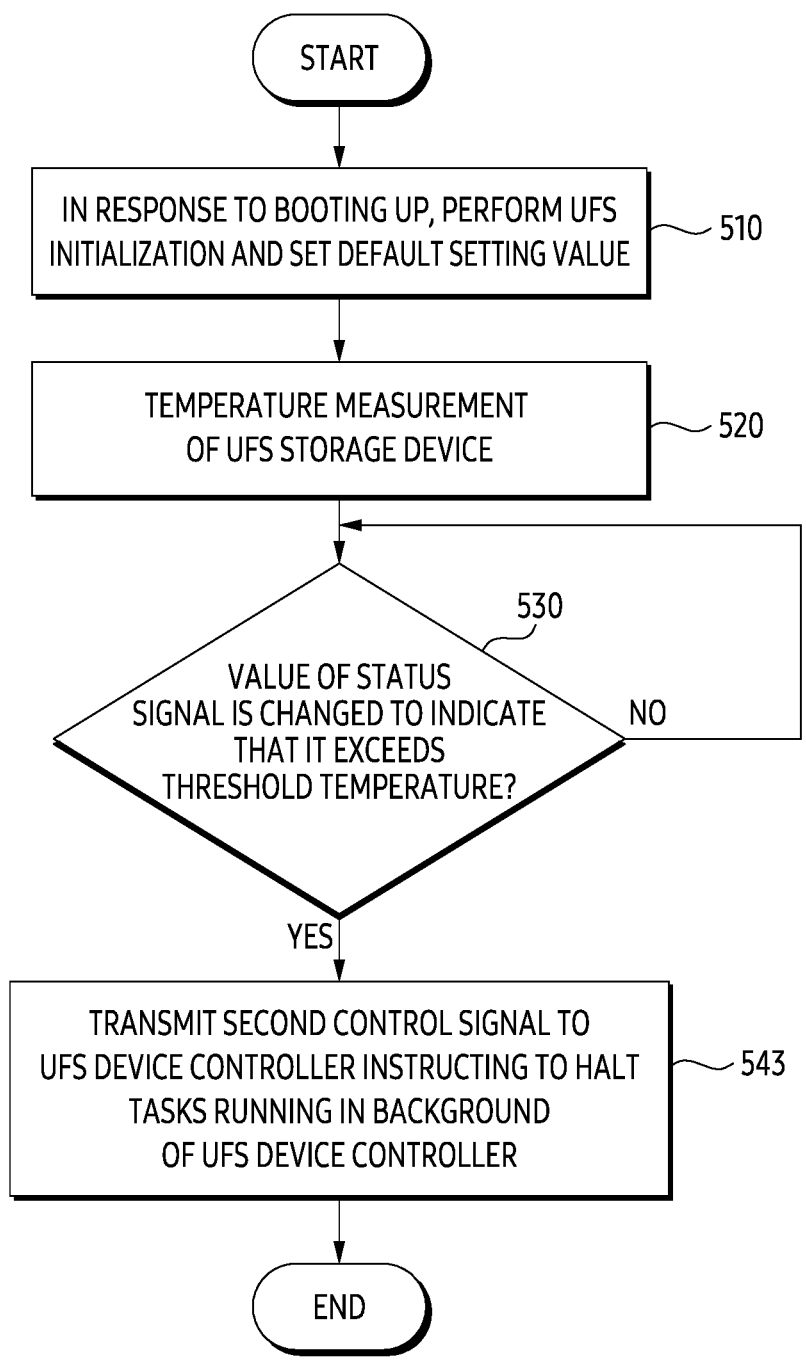

Referring to FIG. 5B, in operation 543, the electronic device 101 (e.g., the processor 120 of FIG. 1) may transmit a second control signal instructing the UFS device controller 222 to halt tasks executed in the background to the UFS device controller 222. The tasks executed in the background may refer to tasks that the UFS device controller 222 performs independently of the UFS host device 210. For example, the UFS device controller 222 may perform garbage collection without receiving a separate command from the UFS host device 210. The garbage collection may be a memory management technique for delaying as much as possible a time point at which a limit of a program/erase cycle, which is durability of a nonvolatile memory, is reached. For example, the UFS device controller 222 may be configured to perform the garbage collection while a read/write task does not occur from the UFS host device 210. UFS host device 210 may identify that the temperature of UFS storage device 220 exceeds the threshold temperature based on the status signal received in operation 530 and instruct to halt the tasks performed in the background. According to the second control signal, the UFS storage device 220 may reduce the current consumption and lower the temperature of the UFS storage device 220 (more specifically, the memory 224) by ceasing tasks executed in the background including the garbage collection.

Figure 5C:
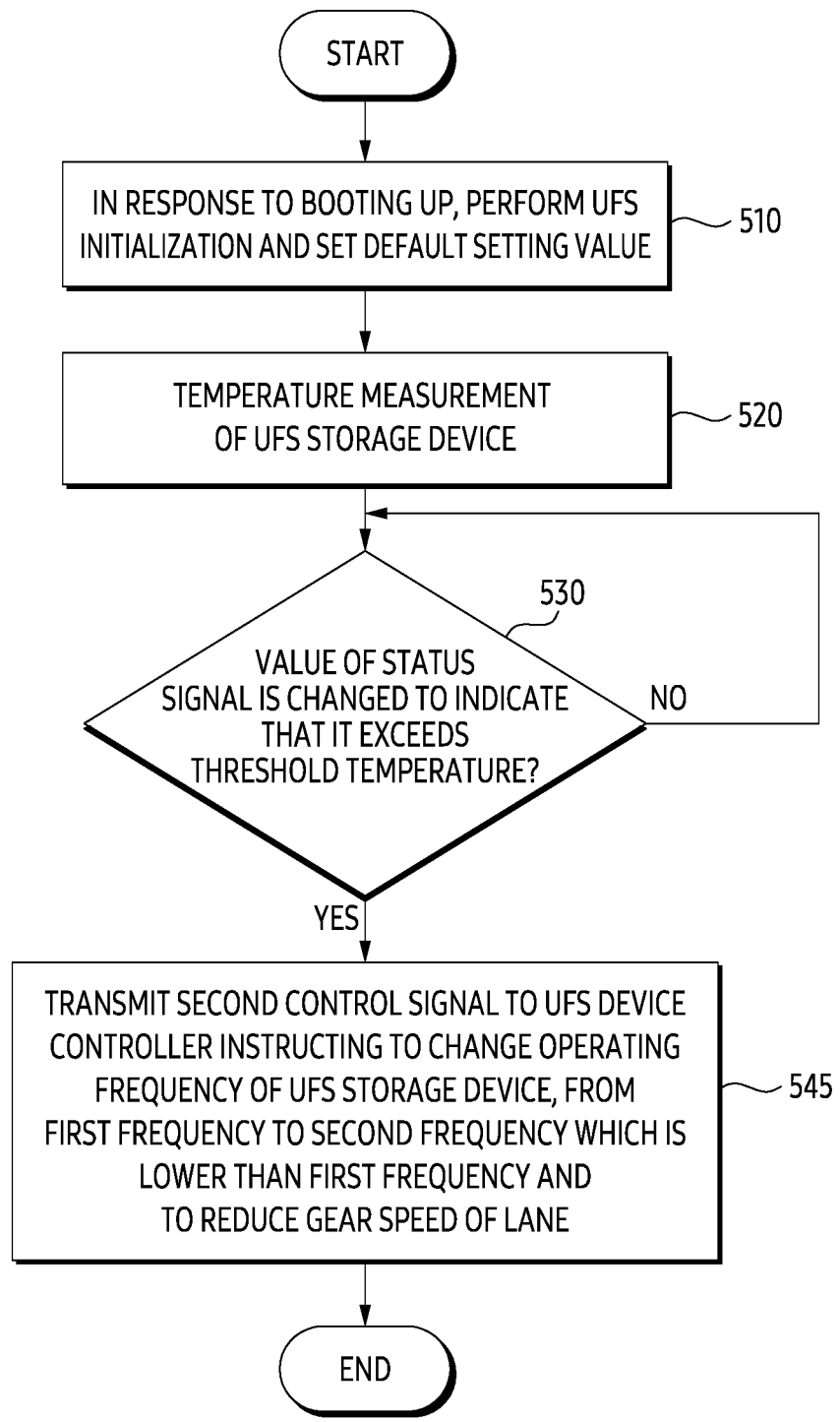

Referring to FIG. 5C, in operation 545, the electronic device 101 may transmit second control signal to UFS storage device 220 instructing to change operating frequency of the UFS storage device 220, from first frequency to second frequency which is lower than first frequency and to reduce gear speed of lanes.

The operating frequency of the UFS storage device 220 may be the frequency of the reference clock (Ref_CLK) illustrated in FIG. 2A. In an embodiment, for example, the reference clock (Ref_CLK) may be any one of 19.2 megahertz (MHz), 26 MHz, and 38.4 MHz.

The gear speed may refer to a data rate, which is a speed at which the first lane (Lane_1) and/or the second lane (Lane_2) of FIG. 2A transmits data. For example, the gear speed may be classified into a pulse width modulation (PWM) gear with a low data rate and a high speed (HS) gear with a high data rate. The PWM gear and the HS gear may be classified into four gear speeds, respectively. In an embodiment, for example, the HS gear may be classified into HS-GEAR 1 at 1248 megabits per seconds (Mbps), HS-GEAR 2 at 2496 Mbps, HS-GEAR 3 at 4992 Mbps, and HS-GEAR 4 at 9984 Mbps.

According to an embodiment, the UFS host device 210 may reduce the operating frequency of the UFS storage device 220 from the first frequency to the second frequency, and may reduce gear speeds of the first lane (LAN_1) and/or the second lane (LAN_2). As the frequency of the reference clock (Ref_CLK) and the gear speed of the lane are reduced, the amount of current consumed by the UFS storage device 220 may be reduced, thereby lowering the temperature of the UFS storage device 220 (more specifically, the memory 224).

Figure 5D:
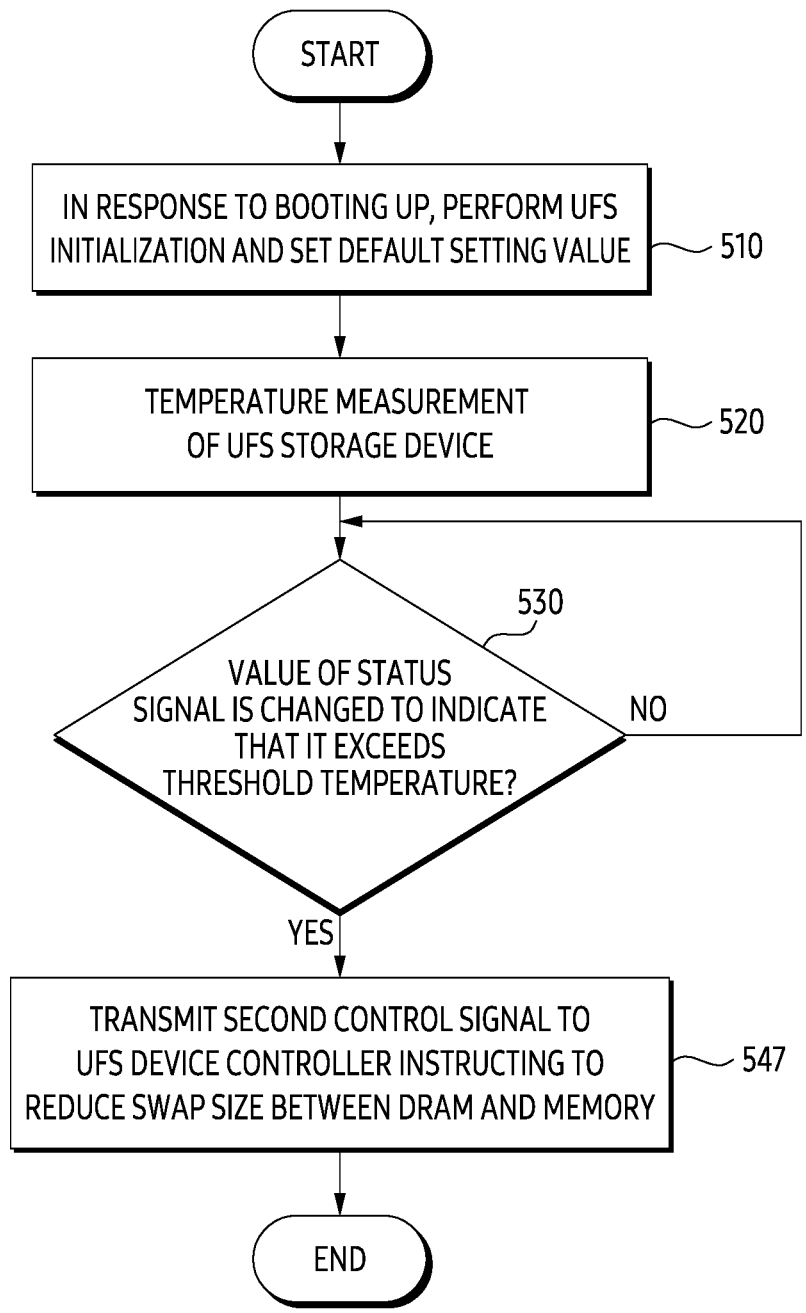

Referring to FIG. 5D, in operation 547, the electronic device 101 (e.g., the processor 120 of FIG. 1) may transmit a second control signal instructing to reduce a swap size between a dynamic random access memory (DRAM) (not shown) and the memory 224 to the UFS device controller 222. The processor 120 of the electronic device 101 may identify data that is called for a predefined number of times or less among data programmed in the DRAM, or that is not called for a predefined period, and swap the data to the memory 224. In addition, the electronic device 101 may identify data that is called more than a predefined number of times from among data programmed in the memory 224 or that has been called for a predefined period and swaps the data with a DRAM (not shown). The processor 120 of the electronic device 101 may reduce amount of the current consumption of the UFS storage device 220 (more specifically, UFS device controller 222) and lower the temperature of the UFS storage device 220 by reducing the swap between DRAM (not shown) and memory 224. That is, the processor 120 may transmit, to the UFS device controller 222, a control signal instructing to bypass programming at least a portion of data stored in the DRAM into the plurality of NAND flash memories 232 or bypass requesting a read operation of at least a portion of data stored in the plurality of NAND flash memories 232 to perform write operation of the at least a portion of the data stored in the plurality of NAND flash memories 232 into the DRAM.

Figure 5E:
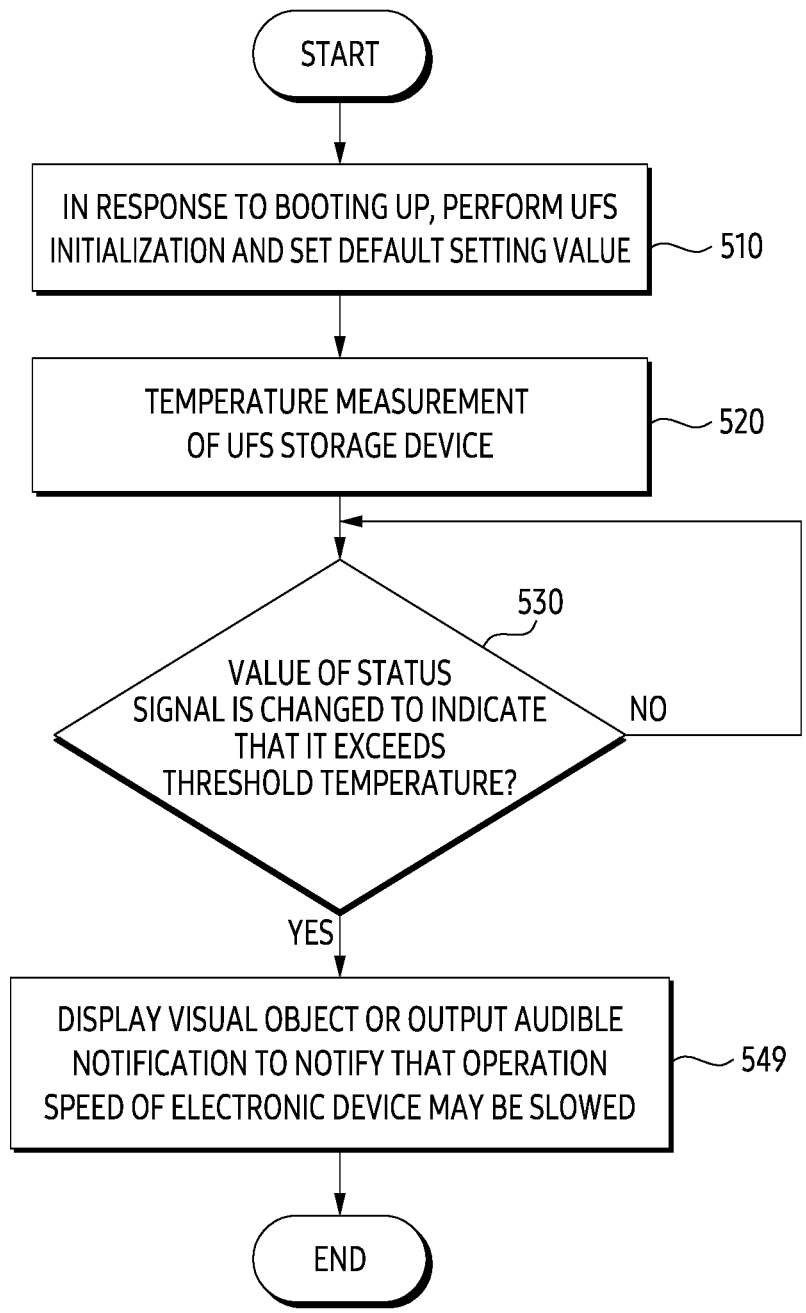

Referring to FIG. 5E, in operation 549, the electronic device 101 (e.g., the processor 120 of FIG. 1) may display a visual object for notifying that the operating speed of the electronic device 101 may be slowed or output an audible notification. In an embodiment, for example, the processor 120 may display a visual object on the screen through the display module 160 including a phrase "temperature of the terminal is too high" or "temperature of the terminal may be too high to slow down". As another example, the processor 120 may output a voice obtained by converting the phrase text to speech (TTS) through the sound output module 155.

Figure 6:
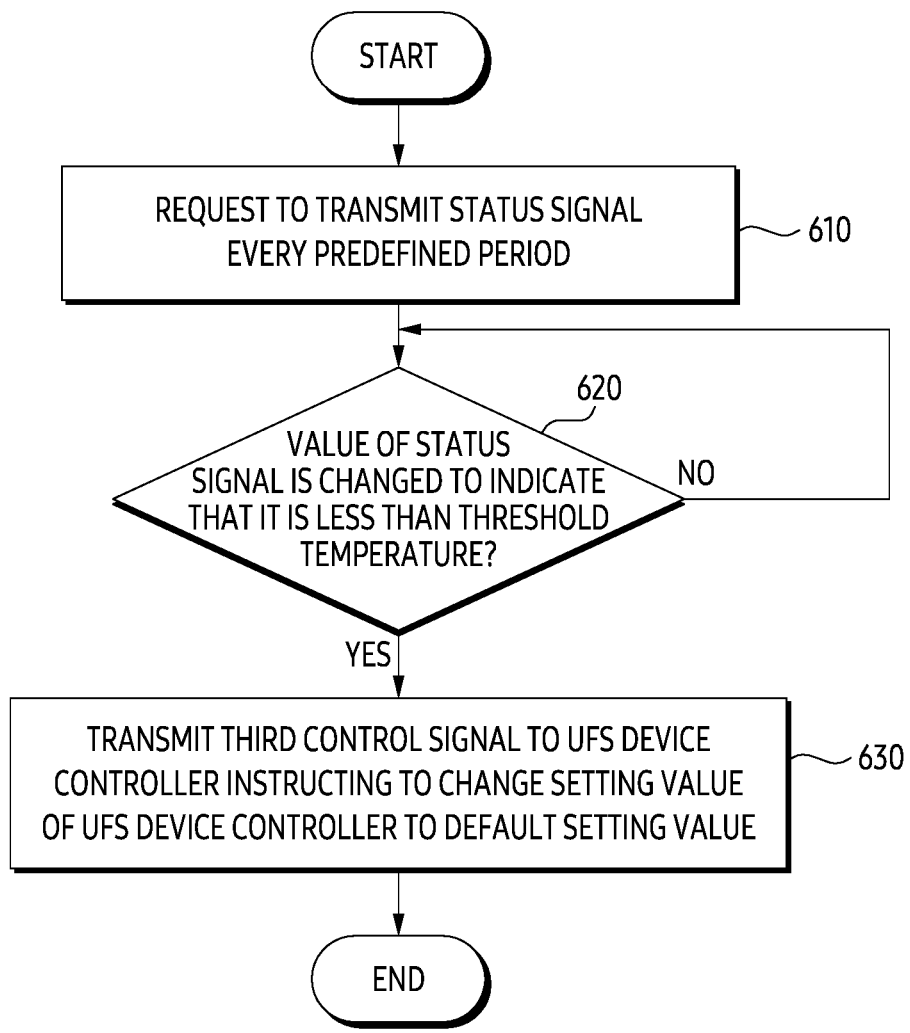
FIG. 6 is a flowchart illustrating an operation of an electronic device when a temperature of a UFS storage device is less than a threshold temperature, according to various embodiments.

FIG. 6 is a flowchart illustrating an operation of an electronic device when a temperature of a UFS storage device 220 is less than a threshold temperature, according to various embodiments.

Referring to FIG. 6, in operation 610, the electronic device 101 (e.g., the processor 120 of FIG. 1) may request the UFS storage device 220 to transmit a status signal every predefined period. For example, the UFS host device 210 of the electronic device 101 may transmit a signal requesting a status signal to the UFS device controller 222 of the UFS storage device 220 whenever a specific time elapses. According to another embodiment, whenever the read/write task requested to the UFS storage device 220 is terminated, the UFS host device 210 may request the UFS device controller 222 to transmit the status signal.

According to various embodiments, the predefined period may correspond to any one of a plurality of predetermined periods between the UFS host device 210 and the UFS storage device 220. In this case, the UFS host device 210 may include a value indicating any one of the plurality of periods in the first control signal and transmit the value to the UFS device controller 222. The UFS device controller 222 may identify which period the status signal should be transmitted to the UFS device controller 222 using a value indicating any one of the plurality of periods.

In operation 620, the electronic device 101 may identify whether the value of the status signal is changed to indicate a temperature less than a threshold temperature. In an embodiment, for example, when bit 3 of the "wException-EventStatus" property included in the above status signal is "Logic High" or "1", the UFS host device 210 may identify that the internal temperature of the UFS storage device 220 (more specifically, the memory 224) may still exceed the threshold temperature and thus the reliability of the data may not be guaranteed. For another example, bit 3 of the "wExceptionEventStatus" property included in the status signal is "Logic Low" or "0", the UFS host device 210 may identify that the internal temperature of the UFS storage device 220 (more specifically, the memory 224) has fallen below the threshold temperature.

In operation 630, the electronic device 101 may transmit a third control signal instructing to change the setting value of the UFS device controller 222 to a default setting value to the UFS device controller 222. In an embodiment, for example, when bit 3 of the "wExceptionEventStatus" attribute included in the status signal in operation 620 is "logic low" or "0", the UFS host device 210 may identify that the UFS storage device 220 operates in a temperature range in which data reliability is guaranteed. Accordingly, in response to boot-up in operation 310 of FIG. 3, the UFS host device 210 may set the UFS storage device 220 again according to the default setting value determined at the time of UFS initialization. For example, the UFS host device 210 may activate the deactivated at least some of the plurality of downstream lanes and the plurality of upstream lanes, and activate the deactivated cache memory 230.

According to various embodiments, the UFS host device 210 may not immediately transmit the third control signal even when the value of the received status signal is changed to indicate that it is less than the threshold temperature in operation 620. For example, in operation 620, the UFS host device 210 may identify indicating that the value of the status signal is less than the threshold temperature, and may request the measurement signal to the UFS device controller 222 again. The UFS host device 210 may compare a temperature sensing value included in the measurement signal with an additional threshold temperature, and when the temperature is less than the additional threshold temperature, then the UFS host device 210 may transmit the third control signal. The additional threshold temperature may be a temperature lower than the threshold temperature. For example, when the threshold temperature is 85° C., the additional threshold temperature may be 60° C. When the set value of the UFS device controller 222 is changed to a default set value through the third control signal immediately after the temperature of the UFS storage device 220 (more specifically, the memory 224) is lower than the threshold temperature, the temperature of the UFS storage device 220 may quickly exceed the threshold temperature again.

In the above-described embodiment, it is described that the status signal is transmitted from the UFS device controller 222 to the UFS host device 210 every predefined period, but it is not limited thereto. According to various embodiments, the UFS device controller 222 may transmit a measurement signal including a temperature sensing value of the UFS storage device 220 at each predefined period. When the UFS host device 210 receives a measurement signal, the UFS host device 210 may compare a temperature sensing value included in the received measurement signal with the threshold temperature to identify whether to transmit the third control signal to the UFS device controller 222.

Figure 7:
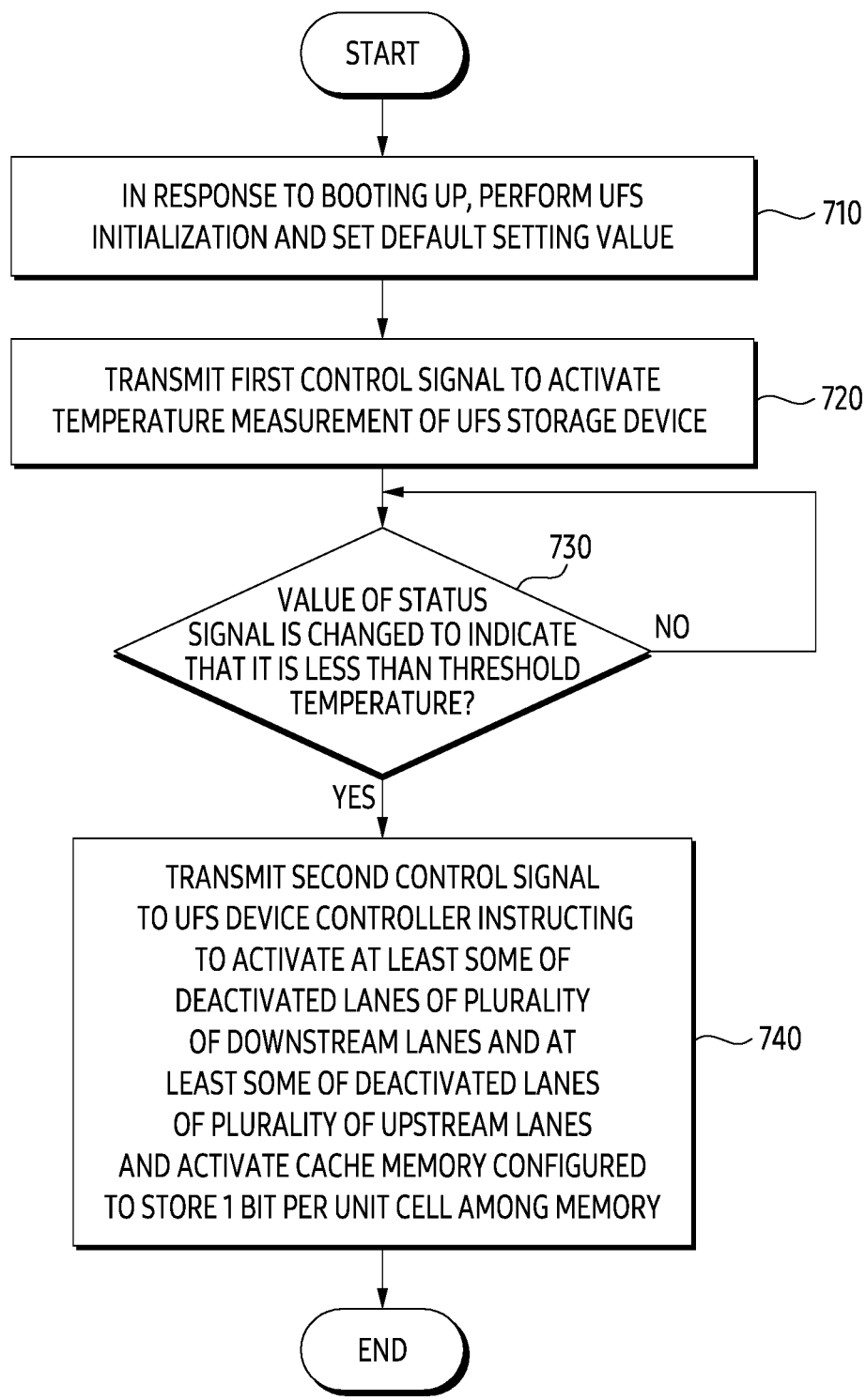
FIG. 7 is a flowchart illustrating an operation of an electronic device when a temperature of a UFS storage device is less than a threshold temperature, according to various embodiments.

FIG. 7 is a flowchart illustrating an operation of an electronic device 101 when a temperature of a UFS storage device 220 is less than a threshold temperature, according to various embodiments.

Referring to FIG. 7, in operation 710, the electronic device 101 (e.g., the processor 120 of FIG. 1) may perform the UFS initialization and set the default setting value in response to boot up. The boot-up may refer to a user's turning on the electronic device 101 to load the operating system 142 stored in the memory 130. In response to the boot up, the electronic device 101 may determine a UFS initialization and a default setting value. The UFS initialization may refer to supplying power to the UFS storage device 220. The default setting value is a value transmitted to the UFS device controller 222 and may include at least one of a frequency of a reference clock (Ref_CLK) for transmitting and receiving data to and from the UFS host device 210, and a value indicating an activated lane of a first lane (Lane_1) and a second lane (Lane_2) of the UFS interface.

In operation 720, the electronic device 101 may transmit a first control signal for activating temperature measurement of the UFS storage device 220. For example, by transmitting the first control signal to the UFS storage device 220, the UFS host device 210 may control the UFS storage device 220 to measure the internal temperature using the temperature sensor 226. According to an embodiment, the first control signal may include a "wExceptionEventControl" attribute. For example, when bit 4 of the "wExceptionEventControl" property is "Logic High" or "1", "TOO_LOW_TEMP_EN" may be activated. The term "TOO_LOW_TEMP_EN" may refer to activation of an event for monitoring whether the internal temperature of the UFS storage device 220 (more specifically, the memory 224) is at a low temperature. The UFS storage device 220 may decode the first control signal received from the UFS host device 210 to activate the temperature sensor 226 when the bit 4 of the "wExceptionEventControl" attribute is "logic high" or "1".

In operation 730, the electronic device 101 may identify whether the value of the status signal is changed to indicate that it is less than the threshold temperature. The UFS device controller 222 may identify whether the temperature value sensed through the temperature sensor 226 exceeds the threshold temperature. The threshold temperature may be a lower limit value of a predefined temperature. For example, the UFS storage device 220 may be required to operate within the predefined temperature range to ensure reliability of data stored in the memory 224. The predefined temperature range may be −20° C. to 85° C., and the threshold temperature may correspond to −20° C. The UFS device controller 222 may transmit a status signal including a comparison result between a temperature sensed through the temperature sensor 226 and the threshold temperature to the UFS host device 210 at every predefined interval. The status signal may include a "wExceptionEventStatus" attribute. The UFS device controller 222 may indicate a comparison result between the temperature sensed through the temperature sensor 226 and the threshold temperature through bit 4 of "wExceptionEventStatus". In an embodiment, for example, when the temperature sensed through the temperature sensor 226 is higher than the threshold temperature, the UFS device controller 222 may transmit a status signal including bit 4 of "wExceptionEventStatus" of "logic low" or "0" to the UFS host device 210. For another example, when the temperature sensed through the temperature sensor 226 is lower than the threshold temperature, the UFS device controller 222 may transmit a status signal including bit 4 of "wExceptionEventStatus" of "logic high" or "1" to the UFS host device 210.

The UFS host device 210 may identify whether the internal temperature of the UFS storage device 220 (more specifically, the memory 224) is less than the threshold temperature by receiving the status signal from the UFS device controller 222 and checking bit 4 of the "wExceptionEventStatus" attribute. According to an embodiment, when the internal temperature of the UFS storage device 220 is greater than or equal to the threshold temperature, Operation 730 may be repeated until the value of the status signal is changed to indicate that it is less than the threshold temperature.

In operation 740, the electronic device 101 may transmit the second control signal instructing to activate at least some of the plurality of downstream lanes and at least some of the plurality of upstream lanes, and to activate the cache memory 230 configured to store 1 bit per unit cell among the memory 224 to the UFS device controller 222.

When the "wExceptionEventStatus" attribute of the status signal indicates that the temperature of the UFS storage device 220 (more specifically, the memory 224) is lower than the threshold temperature, the electronic device 101 may control the UFS storage device 220 to increase the temperature of the UFS storage device 220. The electronic device 101 may increase the temperature of the UFS storage device 220 by increasing the current consumption of the UFS storage device 220 to control the UFS storage device 220 to operate within the predefined temperature range.

According to an embodiment, the UFS device controller 222 may activate at least a portion of inactive lanes among a plurality of downstream lanes and at least a portion of inactive lanes among a plurality of upstream lanes based on the second control signal. For example, the UFS device controller 222 may activate the deactivated lane of the first lane (Lane_1) and the second lane (Lane_2). According to the activation, when both the first lane (Lane_1) and the second lane (Lane_2) are activated, the current consumption of the UFS storage device 220 may increase, and the temperature of the UFS storage device 220 (more specifically, the memory 224) may also increase based on the increase in the current consumption.

According to another embodiment, the UFS device controller 222 may activate the cache memory 230 configured to store 1 bit per unit cell among the memory 224 based on the second control signal. The cache memory 230 may be a buffer memory for improving a write operation to the plurality of NAND flash memories 232. The UFS device controller 222 may increase amount of the current consumption of the UFS storage device 220 by activating the cache memory 230.

In the above-described embodiment, the cache memory 230 is described based on an implementation separately from a plurality of NAND flash memories 232, but is not limited thereto. According to various embodiments, the UFS device controller 222 may perform SLC caching for write-acceleration by controlling at least partial area of the plurality of NAND flash memories 232 to store 1 bit per unit cell. In this case, the UFS device controller 222 may increase the temperature of the UFS storage device 220 (more specifically, the memory 224) by increasing the size of the at least partial area for SLC caching in response to the second control signal.

FIGS. 8A to 8E are flowcharts illustrating an operation of an electronic device 101 when a temperature of a UFS storage device 220 is lower than a threshold temperature, according to various embodiments.

Referring to FIGS. 8A to 8E, operations 810 to 830 may correspond to operations 710 to 730 shown in FIG. 7.

Figure 8A:
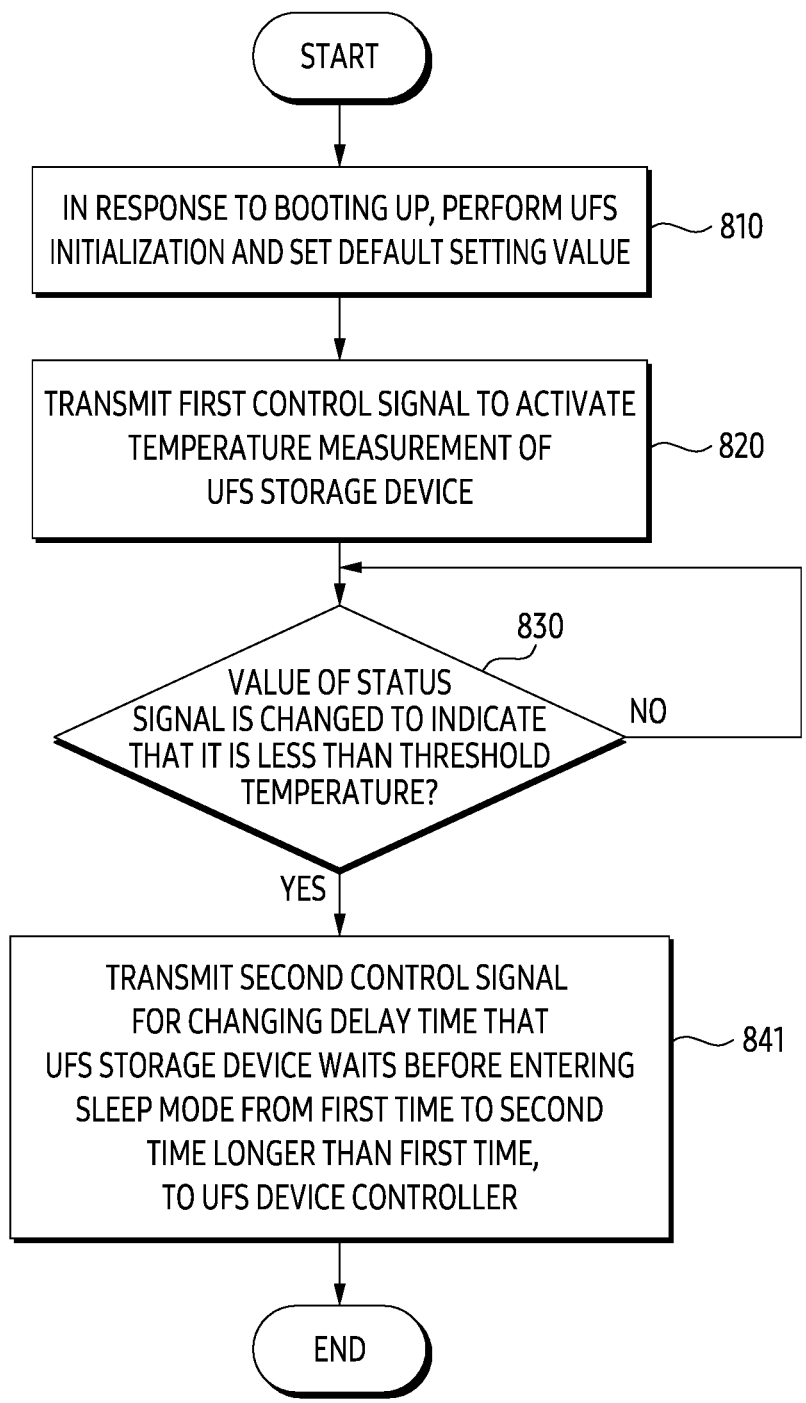
FIGS. 8A to 8E are flowcharts illustrating an operation of an electronic device when a temperature of a UFS storage device is lower than a threshold temperature, according to various embodiments.

Referring to FIG. 8A, in operation 841, the electronic device 101 (e.g., the processor 120 of FIG. 1) may transmit a second control signal for changing a delay time that the UFS storage device 220 waits before entering the sleep mode from a first time to a second time longer than the first time to the UFS device controller 222. In operation 830, the UFS host device 210 may generate the second control signal in response to identifying that the temperature of the UFS storage device 220 (more specifically, the memory 224) is less than the threshold temperature based on the status signal. When a new data input/output request is not entered for the above delay period from the end of the data input/output between the UFS storage device 220 and the UFS host device 210, the sleep mode may be a mode in which the UFS storage device 220 is changed to an inactive state to reduce power consumption of the electronic device 101. For example, the UFS host device 210 may control the UFS storage device 220 to enter the sleep mode more slowly by changing the length of the time the UFS storage device 220 waits, from the first time to the second time longer than the first time using the second control signal. Since the length of the time for the UFS storage device 220 to start entering the sleep mode is increased, the amount of the power consumption of the UFS storage device 220 before the entry is also increased, and based on this, the internal temperature of the UFS storage device 220 (more specifically, the memory 224) may also increase. The delay time is a host trigger signal and may be set to various time intervals according to a manufacturer. According to an embodiment, the second time may be the longest time among time periods that the delay time may have.

Figure 8B:
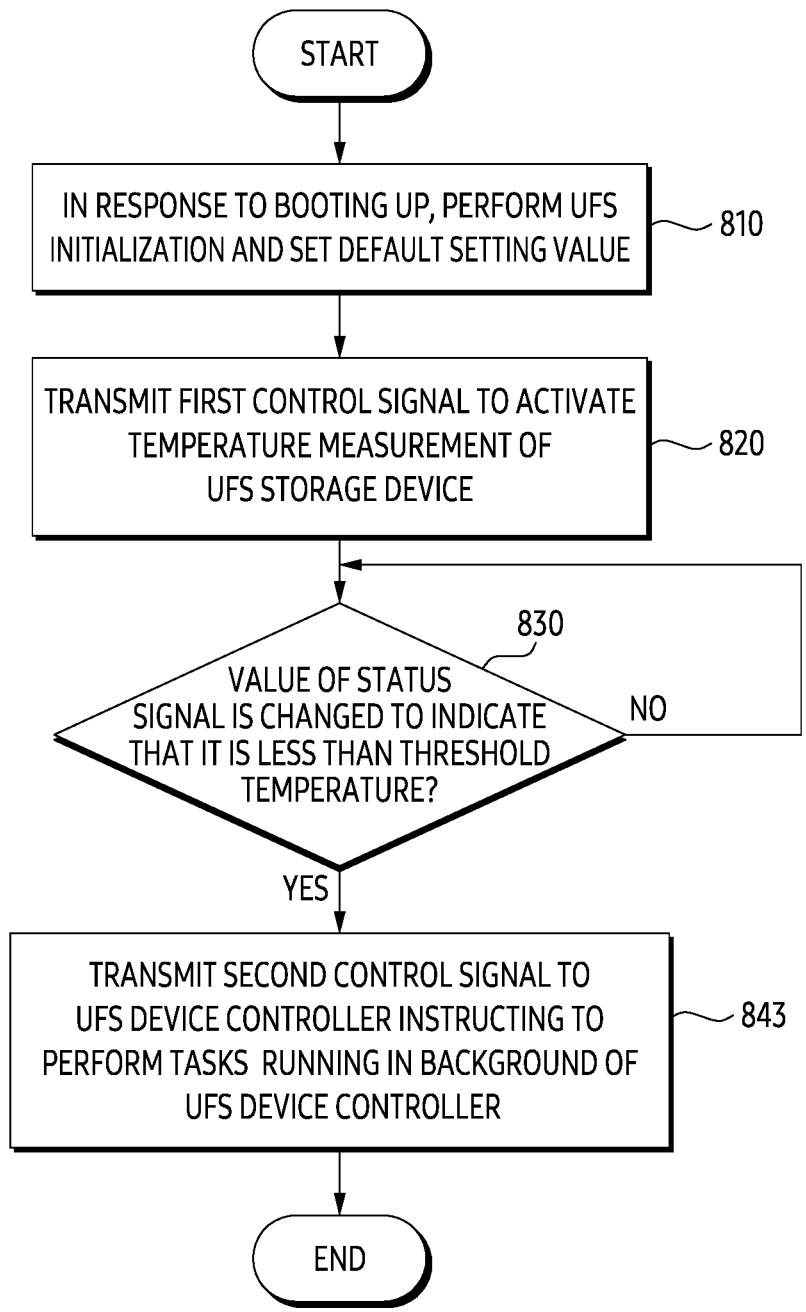

Referring to FIG. 8B, in operation 843, the electronic device 101 (e.g., the processor 120 of FIG. 1) may transmit a second control signal instructing to perform tasks executed in the background of the UFS device controller 222 to the UFS device controller 222. The tasks executed in the background may refer to tasks that the UFS device controller 222 performs independently of the UFS host device 210. For example, the UFS device controller 222 may perform garbage collection without receiving a separate command from the UFS host device 210. The garbage collection may be a memory management technique for delaying as much as possible a time point at which a limit of a program/ease cycle, which is a durability of a nonvolatile memory, is reached. For example, the UFS device controller 222 may be configured to perform the garbage collection while read and/or write task does not occur from the UFS host device 210.

The UFS host device 210 may identify that the temperature of UFS storage device 220 is less than the threshold temperature based on the status signal received in operation 830 and instruct to perform tasks executed in the background. The UFS storage device 220 may increase the current consumption and increase the temperature of the UFS storage device 220 (more specifically, the memory 224) by performing tasks executed in the background including the garbage collection according to the second control signal.

Figure 8C:
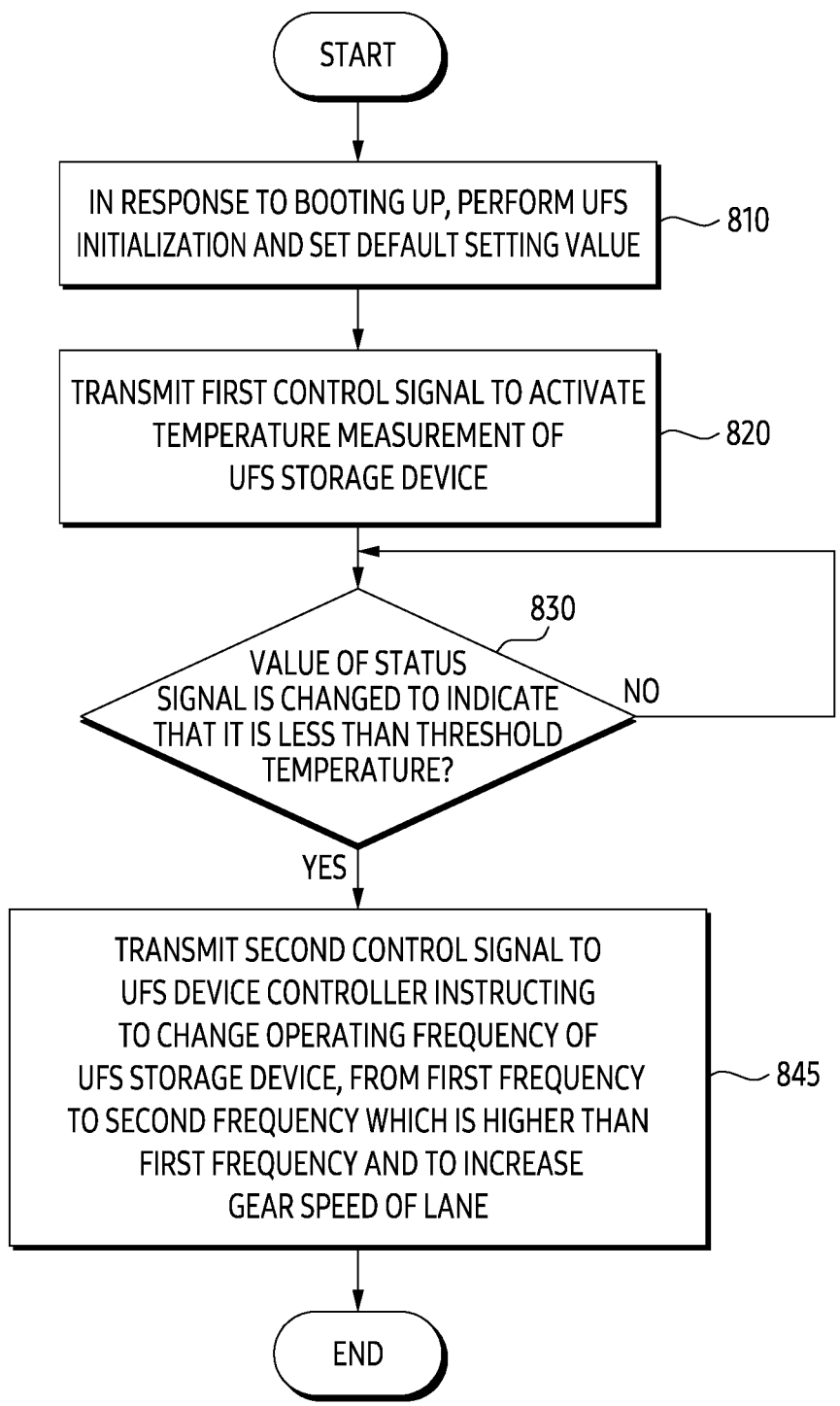

Referring to FIG. 8C, in operation 845, the electronic device 101 (e.g., the processor 120 of FIG. 1) may transmit second control signal to UFS storage device 220 instructing to change operating frequency of storage device 220, from first frequency to second frequency which is higher than first frequency and to increase gear speed of lane.

The operating frequency of the UFS storage device 220 may be the frequency of the reference clock (Ref_CLK) illustrated in FIG. 2A. In an embodiment, for example, the reference clock (Ref_CLK) may be any one of 19.2 MHz, 26 MHz, and 38.4 MHz.

The gear speed may refer to a data rate that is a speed at which the first lane (Lane_1) and/or the second lane (Lane_2) of FIG. 2A transmits data. For example, the gear speed may be classified into a pulse width modulation (PWM) gear with a low data rate and a high speed (HS) gear with a high data rate. The PWM gear and the HS gear may be classified into four gear speeds, respectively. In an embodiment, for example, HS gear may be classified into HS-GEAR 1 at 1248 Mbps, HS-GEAR 2 at 2496 Mbps, HS-GEAR 3 at 4992 Mbps, and HS-GEAR 4 at 9984 Mbps.

According to an embodiment, the UFS host device 210 may increase the operating frequency of the UFS storage device 220 from the first frequency to the second frequency, and may increase gear speeds of the first lane (LAN_1) and/or the second lane (LAN_2). As the frequency of the reference clock (Ref_CLK) and the gear speed of the lane decrease, the amount of current consumed by the UFS storage device 220 may increase, thereby increasing the temperature of the UFS storage device 220 (more specifically, the memory 224).

Figure 8D:
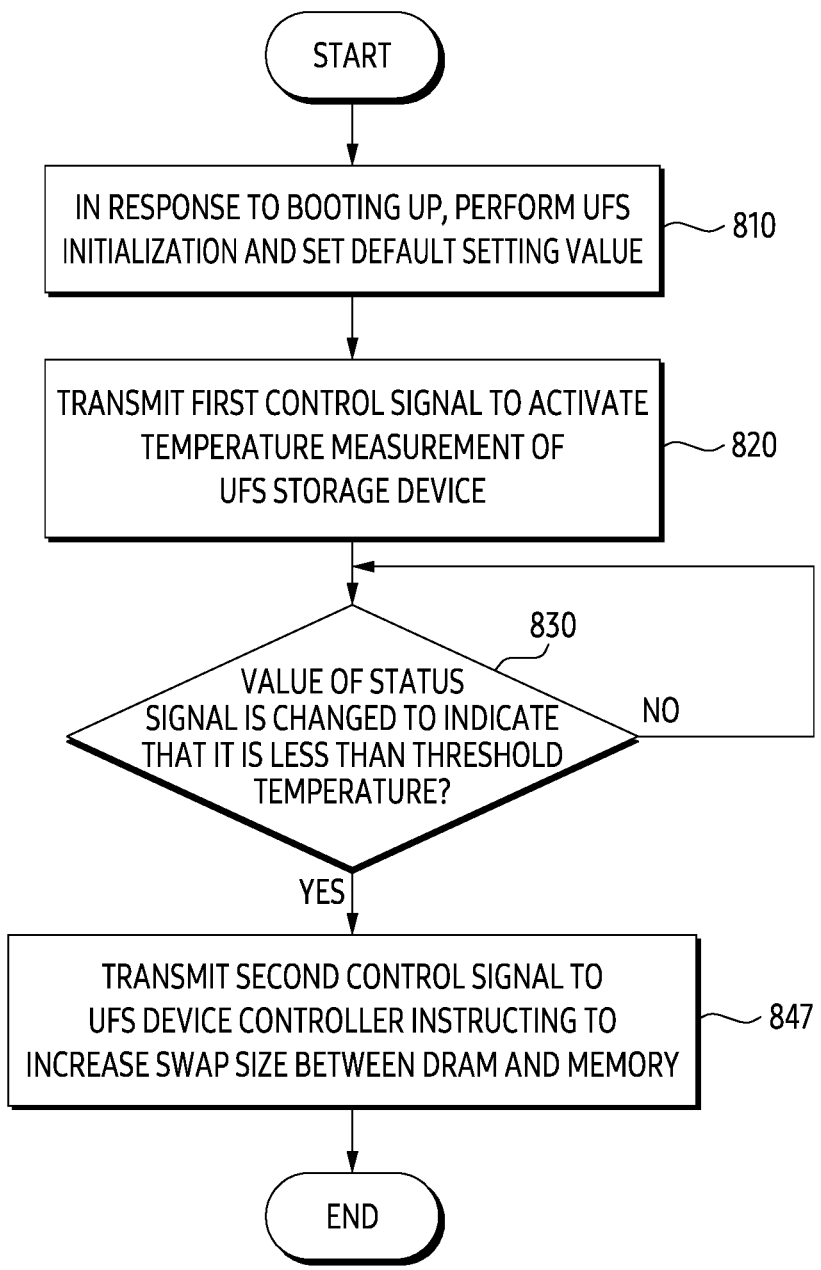

Referring to FIG. 8D, in operation 847, the electronic device 101 (e.g., the processor 120 of FIG. 1) may transmit a second control signal instructing to increase a swap size between a dynamic random access memory (DRAM) (not shown) and the memory 224 to the UFS device controller 222. The processor 120 of the electronic device 101 may identify data that is called for a predefined number of times or less among data programmed in the DRAM, or that is not called for a predefined period, and swap the data to the memory 224. In addition, the electronic device 101 may identify data that is called more than a predefined number of times from among data programmed in the memory 224 or that has been called for a predefined period and swaps the data with a DRAM (not shown). The processor 120 of the electronic device 101 may increase amount of the current consumption of the UFS storage device 220 (more specifically, UFS device controller 222) and increase the temperature of the UFS storage device 220 by increasing the swap size between DRAM (not shown) and memory 224. That is, the processor 120 may transmit, to the UFS device controller 222, a control signal instructing to increase a size of data for programming at least a portion of data stored in the DRAM into the plurality of NAND flash memories 232 or increase a size of data for requesting a read operation of at least a portion of data stored in the plurality of NAND flash memories 232 to perform write operation of the at least a portion of the data stored in the plurality of NAND flash memories 232 into the DRAM.

Figure 8E:
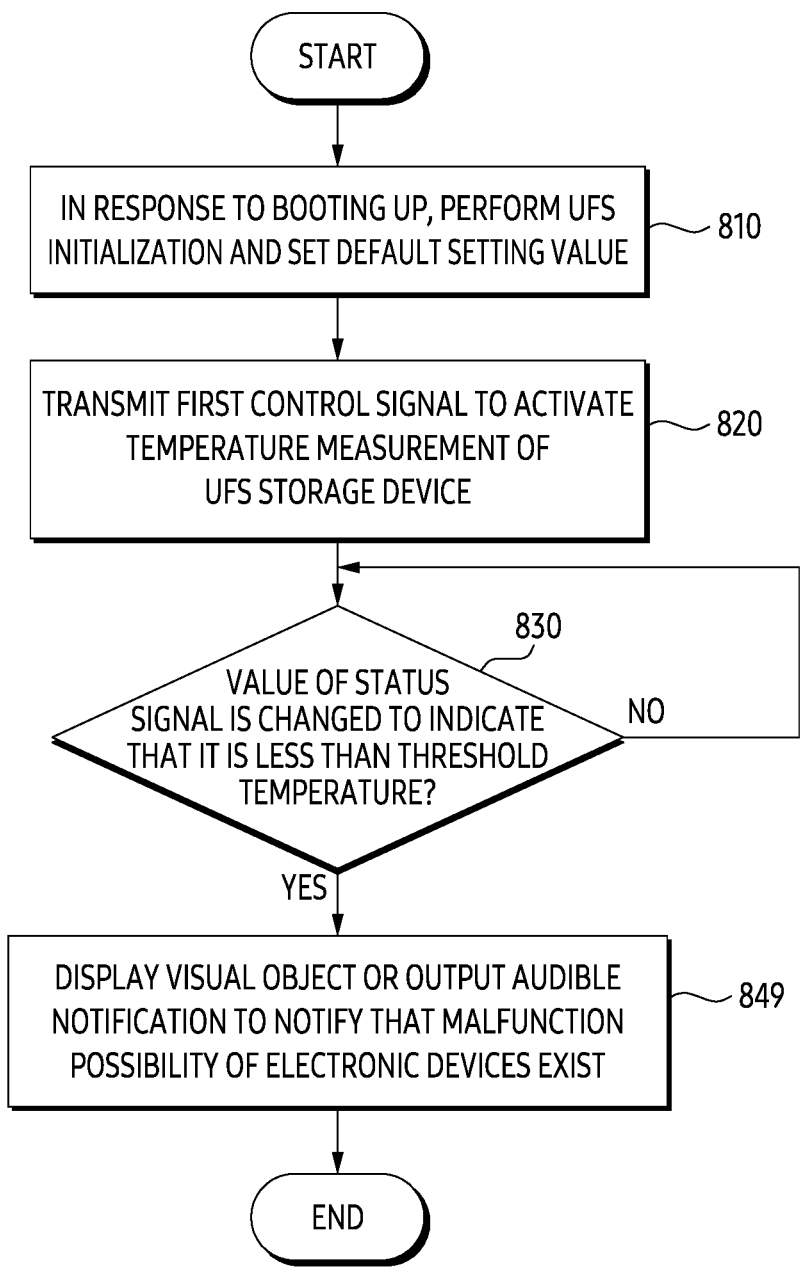

Referring to FIG. 8E, in operation 849, the electronic device 101 (e.g., the processor 120 of FIG. 1) may a display visual object or output an audible notification to notify that malfunction possibility of the electronic device 101 exist. In an embodiment, for example, the processor 120 may display a visual object including a warning phrase such as "The temperature of the terminal is too low" or "An error may occur because the temperature of the terminal is too low" through the display module 160. For another example, the processor 120 may output a voice obtained by converting the warning phrase text to speech (TTS) through the sound output module 155.

Figure 9:
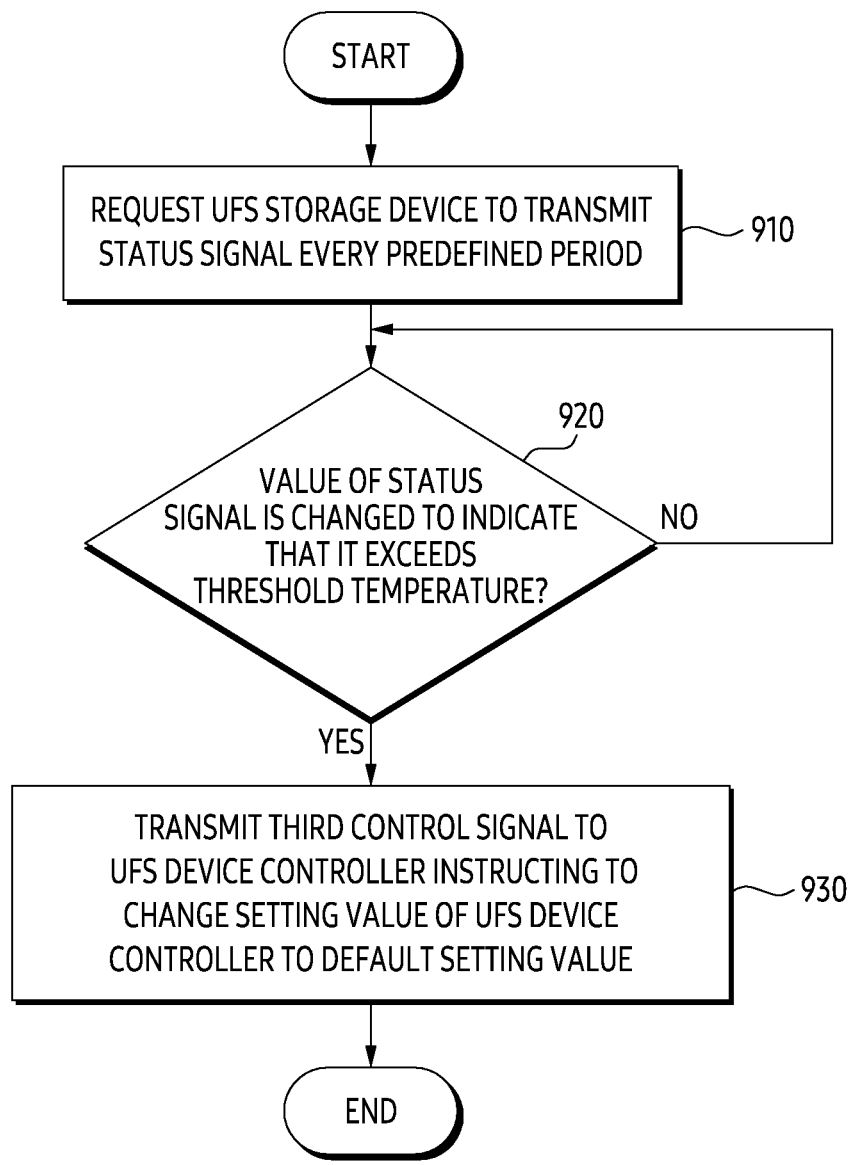
FIG. 9 is a flowchart illustrating an operation of an electronic device when a temperature of a UFS storage device is greater than a threshold temperature, according to various embodiments.

FIG. 9 is a flowchart illustrating an operation of an electronic device 110 when a temperature of a UFS storage device 220 is greater than a threshold temperature, according to various embodiments. Referring to FIG. 9, in operation 910, the electronic device 101 (e.g., the processor 120 of FIG. 1) may request the UFS storage device 220 to transmit a status signal every predefined period. For example, the UFS host device 210 of the electronic device 101 may transmit a signal requesting a status signal to the UFS device controller 222 of the UFS storage device 220 whenever a specific time elapses. According to another embodiment, the UFS host device 210 may request the UFS device controller 222 to transmit the status signal whenever the read and/or write task requested by the UFS storage device 220 is terminated.

According to various embodiments, the predefined period may correspond to any one of a plurality of predetermined periods between the UFS host device 210 and the UFS storage device 220. In this case, the UFS host device 210 may include a value indicating any one of the plurality of periods in the first control signal and transmit the value to the UFS device controller 222. The UFS device controller 222 may identify which period the status signal should be transmitted to the UFS device controller 222 using a value indicating any one of the plurality of periods.

In operation 920, the electronic device 101 may identify whether the value of the status signal is changed to indicate that the value of the status signal exceeds the threshold temperature. In an embodiment, for example, when bit 4 of the "wExceptionEventStatus" attribute included in the status signal is "Logic High" or "1", it may be identified that the internal temperature of the UFS storage device 220 (more specifically, the memory 224) is still a low temperature less than the threshold temperature, and that reliability of data cannot be guaranteed. For another example, when bit 4 of the "wExceptionEventStatus" attribute included in the status signal is "logically low" or "0", the UFS host device 210 may identify that the internal temperature of the UFS storage device 220 has risen above the threshold temperature.

In operation 930, the electronic device 101 may transmit a third control signal instructing to change the setting value of the UFS device controller 222 to a default setting value to the UFS device controller 222. In an embodiment, for example, when bit 4 of the "wExceptionEventStatus" attribute included in the status signal in operation 920 is "logic low" or "0", the UFS host device 210 may identify that the UFS storage device 220 operates in a temperature range in which data reliability is guaranteed. Accordingly, in response to boot-up in operation 310 of FIG. 3, the UFS host device 210 may set the UFS storage device 220 again according to the default setting value determined at the time of UFS initialization. For example, the UFS host device 210 may deactivate the activated at least some of the plurality of downstream lanes and the plurality of upstream lanes, and deactivate the activated cache memory 230.

According to various embodiments, even when the UFS host device 210 is changed to indicate that the value of the received status signal is higher than a threshold temperature in operation 920, the third control signal may not be immediately transmitted. For example, in operation 920, the UFS host device 210 may identify indicating that the value of the status signal is higher than the threshold temperature, and may request the measurement signal to the UFS device controller 222 again. The UFS host device 210 may compare a temperature sensing value included in the measurement signal with an additional threshold temperature, and when the temperature is higher than the additional threshold temperature, then the UFS host device 210 may transmit the third control signal. The additional threshold temperature may be a temperature higher than the threshold temperature. In an embodiment, for example, when the threshold temperature is −20° C., the additional threshold temperature may be −10° C. When the setting value of the UFS device controller 222 is changed to a default setting value through the third control signal immediately after the temperature of the UFS storage device 220 (more specifically, the memory 224) is higher than the threshold temperature, the temperature of the UFS storage device 220 may quickly drop lower than the threshold temperature in the near time again.

In the above-mentioned embodiment, it is described that the status signal is transmitted from the UFS device controller 222 to the UFS host device 210 every predefined period, it is not limited thereto. According to various embodiments, the UFS device controller 222 may transmit a measurement signal including a temperature sensing value of the UFS storage device 220 at each predefined period. When the UFS host device 210 receives a measurement signal, the UFS host device 210 may compare a temperature sensing value included in the received measurement signal with the threshold temperature to identify whether to transmit the third control signal to the UFS device controller 222.

Figure 10:
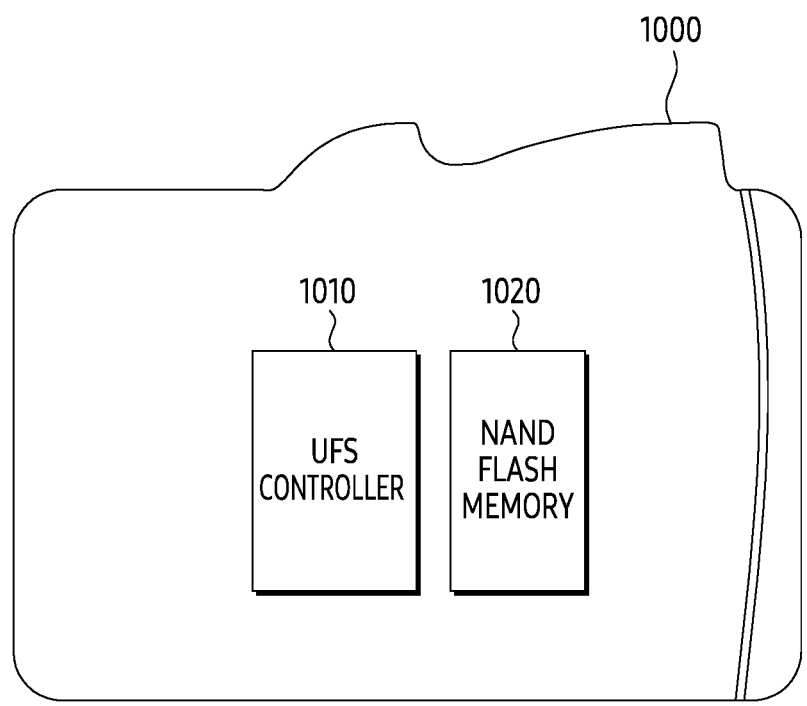
FIG. 10 illustrates a UFS card according to various embodiments.

FIG. 10 illustrates a UFS card 1000 according to various embodiments.

Referring to FIG. 10, the UFS card 1000 may include a UFS device controller 1010 and a NAND flash memory 1020. As the UFS card 1000 has the same shape as a memory card, the UFS card 1000 may be coupled to other components of the electronic device 101 to be detached and attached through a connection interface. The UFS card 1000 may be a device to which a standard protocol such as Universal Flash Storage (UFS) is applied.

According to an embodiment, the connection interface may be connected to the electronic device 101 and the UFS card 1000 to provide a connection capable of transmitting and receiving data. The connection interface may be implemented in various interface methods such as Advanced Technology Attachment (ATA), SATA (Serial ATA), e-SATA (external SATA), SCSI (Small Computer Small Interface), SAS (Serial Attached SCSI), PCI (Peripheral Component Interconnection), PCIe (PCI express), NVMe (NVM express), IEEE 1394, USB (universal serial bus), SD (secure digital) card, MMC (multi-media card), eMMC (embedded multi-media card), UFS (Universal Flash Storage), eUFS (embedded Universal Flash Storage) and CF (compact flash) card interface.

The UFS card 1000 according to an embodiment may receive first control signal from the electronic device 101 connected through the connection interface, sense the temperature of the UFS card 1000, identify whether the temperature sensing value is outside a predefined temperature range to ensure reliability of data to transmit a status signal to the electronic device 101 and change at least one of the operating frequencies of the UFS card 1000, the operating frequency of the UFS card 1000, the gear speed of lanes, the number of active lanes, whether SLC caching of the memory 224 is activated, the length of the delay time to wait before entering the sleep mode, Whether tasks executed in the background of the UFS card 1000 are halted, and a swap size between the DRAM (not shown) of the electronic device 101 and the UFS card 1000 by receiving the second control signal from the electronic device 101.

Figure 11:
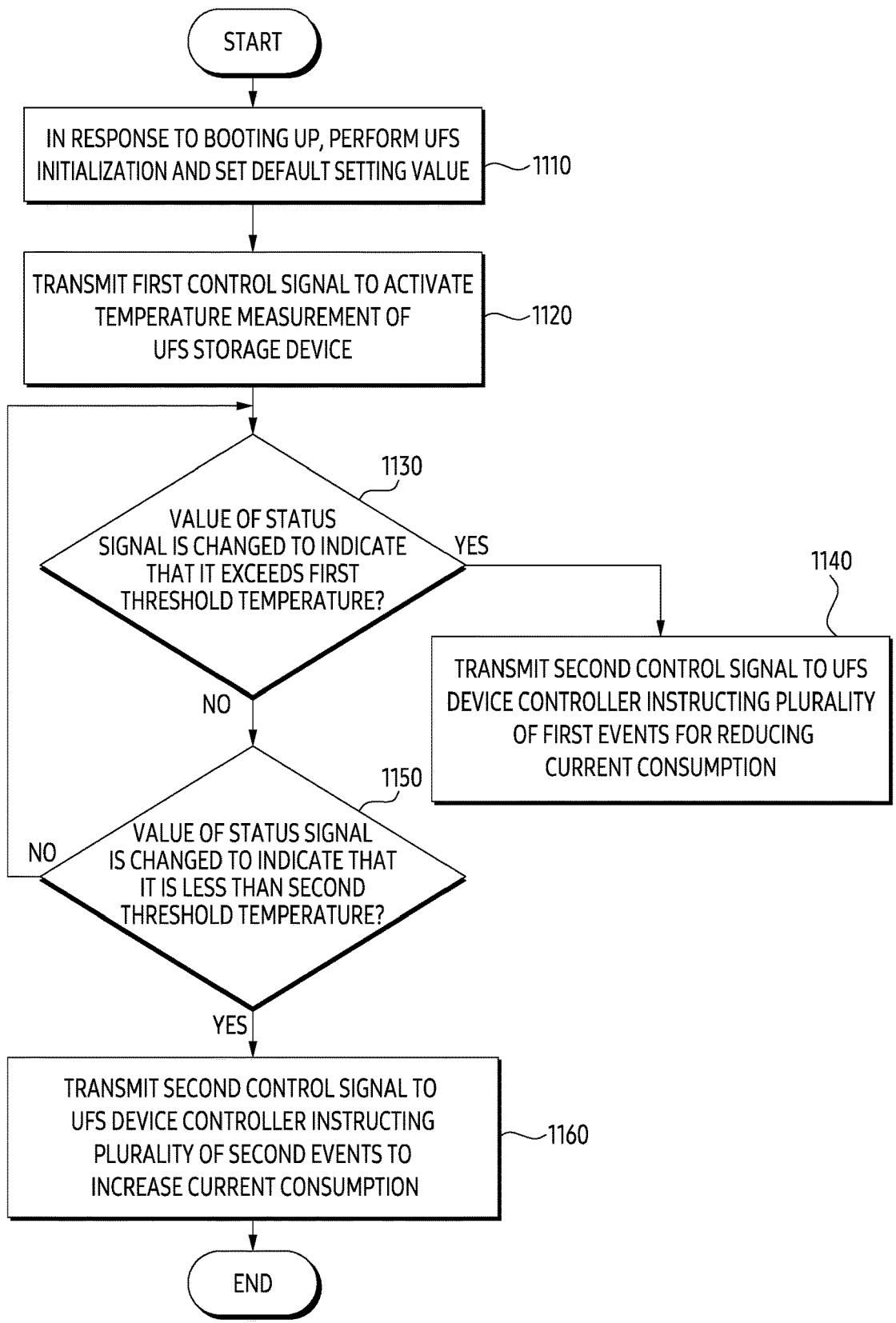
FIG. 11 is a flowchart illustrating an operation of the electronic device 101 when a temperature of the UFS storage device 220 is greater than a first threshold temperature or is less than a second threshold temperature, according to various embodiments.

FIG. 11 is a flowchart illustrating an operation of the electronic device 101 when a temperature of the UFS storage device 220 (more specifically, the memory 224) exceeds a first threshold temperature or is less than a second threshold temperature, according to various embodiments.

Referring to FIG. 11, in operation 1110, the electronic device 101 (e.g., the processor 120 of FIG. 1) may perform the UFS initialization and may set the default setting value in response to boot up.

Operation 1110 may correspond to operation 310 of FIG. 3.

In operation 1120, the electronic device 101 may transmit a first control signal for activating temperature measurement of the UFS storage device 220. Operation 1120 may correspond to operation 320 of FIG. 3.

In operation 1130, the electronic device 101 may identify whether the value of the status signal is changed to indicate that the value of the status signal exceeds the first threshold temperature. The first threshold temperature may be the largest value among temperature ranges for ensuring reliability of data stored in memory 224. The UFS host device 210 may receive a status signal from the UFS device controller 222 and identify whether the temperature of the UFS storage device 220 (more specifically, the memory 224) exceeds the first threshold temperature based on the status signal.

In operation 1140, the electronic device 101 may transmit a second control signal instructing a plurality of first events for reducing the current consumption to the UFS storage device 220. In operation 1130, since it is identified that the temperature of the UFS storage device 220 exceeds the first threshold temperature, the UFS host device 210 may control the UFS storage device 220 to operate in the temperature range for ensuring reliability by reducing the temperature of the UFS storage device 220 (more specifically, the memory 224). Accordingly, the UFS host device 210 may transmit a plurality of first events to reduce heat generation of the UFS storage device 220 by reducing the magnitude of the current consumption to the UFS device controller 222 of the UFS storage device 220 through the second control signal. The plurality of first events may include at least one of operation 340 of FIG. 3 and operation 541 to operation 549 of FIGS. 5A to 5E.

In operation 1150, the electronic device 101 may identify whether the value of the status signal is changed to indicate that the value of the status signal is less than the second threshold temperature. The second threshold temperature may be the smallest value among temperature ranges for ensuring reliability of data stored in memory 224. The UFS host device 210 may receive a status signal from the UFS device controller 222 and identify whether the temperature of the UFS storage device 220 (more specifically, the memory 224) is less than the second threshold temperature based on the status signal. When the temperature of the UFS storage device 220 is greater than the second threshold temperature, the UFS host device 210 may identify that the UFS storage device 220 operates within the temperature range for ensuring reliability, and may repeatedly monitor the internal temperature by repeating operation 1130.

In operation 1160, the electronic device 101 may transmit a second control signal instructing a plurality of second events for increasing the current consumption to the UFS storage device 220. In operation 1150, since it is identified that the temperature of the UFS storage device 220 (more specifically, the memory 224) is less than the second threshold temperature, the UFS host device 210 may control the UFS storage device 220 to operate in the temperature range for ensuring reliability by increasing the temperature of the UFS storage device 220. Accordingly, the UFS host device 210 may generate heat from the UFS storage device 220 by increasing the amount of the current consumption, and transmit a plurality of second events for increasing the temperature of the UFS storage device 220 (more specifically, the memory 224) to the UFS device controller 222 of the UFS storage device 220 through the second control signal. The plurality of second events may include at least one of operation 740 of FIG. 7 and operation 841 to operation 849 of FIGS. 8A to 8E.

According to an embodiment, an electronic device may comprise at least one processor, a Universal Flash Storage (UFS) device controller operatively coupled with the at least one processor, a UFS interface including a plurality of downstream lanes for transmitting data from the at least one processor to the UFS device controller, and a plurality of upstream lanes for transmitting data from the UFS device controller to the at least one processor, and storage including a plurality of non-volatile memories and a cache memory. The at least one processor may transmit, in response to booting up of the at least one processor, a first control signal to instruct measuring a temperature of the storage using a temperature sensor operatively coupled to the UFS device controller, and identifying of the measured temperature exceeding a threshold value to the UFS device controller. The at least one processor may receive a status signal indicating that the temperature of the storage measured by the temperature sensor exceeds the threshold value from the UFS device controller.

The at least one processor may transmit, based on the status signal, to the UFS device controller, a second control signal to instruct deactivating at least some of the plurality of downstream lanes and the plurality of upstream lanes, or deactivating the cache memory which stores 1 bit per unit cell in the storage.

According to an embodiment, the at least one processor may be configured to transmit, to the UFS device controller, the second control signal for changing a delay time, from a first time to a second time which is shorter than the first time, where the delay time is a length of a waiting time before the storage enters a sleep mode based on the status signal.

According to an embodiment, the second time may correspond to a minimum value of a time range in which the delay time may be set.

According to an embodiment, the at least one processor is configured to transmit to the UFS device controller, the second control signal instructing to halt tasks running in the background of the UFS device controller based on the status signal.

According to an embodiment, tasks executed in the background may include garbage collection and wear leveling.

According to an embodiment, the at least one processor is configured to transmit, to the UFS device controller, the second control signal instructing to change an operating frequency of the UFS device controller, from a first frequency to a second frequency which is lower than the first frequency based on the status signal.

According to an embodiment, the second frequency may correspond to the smallest frequency among a plurality of frequency values that the operating frequency of the UFS device controller may have.

According to an embodiment, the second frequency may be varied based on a size of a transmitting and receiving bandwidth between the UFS device controller and the at least one processor.

According to an embodiment, the first control signal may correspond to a signal including a wExceptionEventControl value, and the status signal may correspond to a signal including a wExceptionEventStatus value.

According to an embodiment, the electronic device may further include a dynamic random access memory (DRAM) operatively coupled to the at least one processor, and where the at least one processor may be configured to transmit, to the UFS device controller, the second control signal instructing to bypass programming at least a portion of data stored in the DRAM into the plurality of non-volatile memories or bypass requesting a read operation of at least a portion of data stored in the non-volatile memories to perform write operation of the at least a portion of the data stored in the non-volatile memories into the DRAM.

According to an embodiment, the at least one processor may be configured to display a visual object for notifying that an operating speed of the electronic device may be slowed through a display operatively coupled to the at least one processor based on the status signal and output an audible notification for notifying that an operating speed of the electronic device may be decreased through an audio output module operatively coupled to the at least one processor.

According to an embodiment, the cache memory may correspond to a single-level cell (SLC) flash memory, and the plurality of non-volatile memories may correspond to at least one of a multi-level cell (MLC) flash memory, a triple-level cell (TLC) flash memory, and a quad-level cell (QLC) flash memory configured to store at least 2 bits per unit cell.

According to an embodiment, the at least one processor may be configured such that in response to receiving the status signal, the UFS device controller requests a temperature value of the storage measured using the temperature sensor to receive a measurement signal indicating the temperature value of the storage.

According to an embodiment, in response to requesting the measurement signal to the UFS device controller every predefined period and identifying that the temperature of the storage identified through the measurement signal is within a predefined temperature range, the at least one processor may be configured to transmit a third control signal instructing to reactivate at least some of the plurality of downstream lanes deactivated and at least some of the plurality of upstream lanes and reactivate the deactivated cache memory to the UFS device controller.

According to an embodiment, the at least one processor may be configured to request the UFS device controller to transmit the status signal to the at least one processor based on a predefined period, and in response to identifying that the measured temperature of the storage is less than the threshold value based on the status signal, transmit, to the UFS device controller, a third control signal instructing to re-activate at least some of the deactivated plurality of downstream lanes and at least some of the deactivated plurality of upstream lanes, and to re-activate the deactivated cache memory.

According to an embodiment, an electronic device may comprise at least one processor, a Universal Flash Storage (UFS) device controller operatively coupled with the at least one processor, a UFS interface including a plurality of downstream lanes for transmitting data from the at least one processor to the UFS device controller, and a plurality of upstream lanes for transmitting data from the UFS device controller to the at least one processor and a storage including a plurality of non-volatile memories and a cache memory. The at least one processor may be configured to transmit, to the UFS device controller, a first control signal instructing to identify that a measured temperature of the storage is less than a threshold value by using a temperature sensor operatively coupled to the UFS device controller. The at least one processor may be configured to receive, from the UFS device controller, a status signal indicating that the temperature of the storage measured by the temperature sensor is less than the threshold value, and based on the status signal. The at least one processor may be configured to transmit, to the UFS device controller, a second control signal to instruct activating one or more deactivated lanes among the plurality of downstream lanes and the plurality of upstream lanes, and activating the cache memory which stores 1 bit per unit cell in the storage.

According to an embodiment, the at least one processor may be configured to transmit, to the UFS device controller, the second control signal for changing a delay time, from a first time to a second time which is longer than the first time, where the delay time is a length of a waiting time before the storage enters a sleep mode based on the status signal.

According to an embodiment, the second time may correspond to a maximum value of a time range in which the delay time may be set.

According to an embodiment, the at least one processor may be configured to transmit, to the UFS device controller, the second control signal instructing to execute tasks which is running in the background of the UFS device controller based on the status signal.

According to an embodiment, tasks executed in the background may include garbage collection and wear leveling.

According to an embodiment, the at least one processor may be configured to transmit, to the UFS device controller, the second control signal instructing to change the operating frequency of the UFS device controller, from a first frequency to a second frequency higher than the first frequency based on the status signal.

According to an embodiment, the second frequency may correspond to the highest frequency among a plurality of frequency values that the operating frequency of the UFS device controller may have.

According to an embodiment, the second frequency may be varied based on a size of a transmitting and receiving bandwidth between the UFS device controller and the at least one processor.

According to an embodiment, the first control signal may correspond to a signal including a wExceptionEventControl value, and the status signal may correspond to a signal including a wExceptionEventStatus value.

According to an embodiment, the electronic device may further include a dynamic random access memory (DRAM) operatively coupled to the at least one processor, and where the at least one processor may be configured to transmit, to the UFS device controller, the second signal instructing to increase a size of data for programming at least a portion of the data stored in the DRAM into the plurality of non-volatile memories or to increase a size of data for requesting a read operation of at least a portion of data stored in the non-volatile memories to perform write operation of the at least a portion of the data stored in the non-volatile memories into the DRAM.

According to an embodiment, the at least one processor may be configured to display a visual object for notifying that a possibility of malfunction of the electronic device may be exist through a display operatively coupled to the at least one processor based on the status signal and output an audible notification for notifying that a possibility of malfunction of the electronic device may be exist through an audio output module operatively coupled to the at least one processor.

According to an embodiment, the cache memory may correspond to a single-level cell (SLC) flash memory, and the plurality of non-volatile memories may correspond to at least one of a multi-level cell (MLC) flash memory, a triple-level cell (TLC) flash memory, and a quad-level cell (QLC) flash memory configured to store at least 2 bits per unit cell.

According to an embodiment, the at least one processor may be configured such that in response to receiving the status signal, the UFS device controller requests a temperature value of the storage measured using the temperature sensor to receive a measurement signal indicating the temperature value of the storage.

According to an embodiment, in response to requesting the measurement signal to the UFS device controller every predefined period and identifying that the temperature of the storage identified through the measurement signal is within a predefined temperature range, the at least one processor may be configured to transmit a third control signal instructing to deactivate at least some of the plurality of downstream lanes activated and at least some of the plurality of upstream lanes and deactivate the activated cache memory to the UFS device controller.

According to an embodiment, the at least one processor may be configured to request the UFS device controller to transmit the status signal to the at least one processor based on a predefined period, and in response to identifying that the measured temperature of the storage is greater than the threshold value based on the status signal, transmit, to the UFS device controller, a third control signal instructing to re-deactivate at least some of the activated plurality of downstream lanes and at least some of the activated plurality upstream lanes, and to re-deactivate the activated cache memory.

According to an embodiment, an electronic device may comprise at least one processor, a Universal Flash Storage (UFS) device controller operatively coupled with the at least one processor, a UFS interface including a plurality of downstream lanes for transmitting data from the at least one processor to the UFS device controller, and a plurality of upstream lanes for transmitting data from the UFS device controller to the at least one processor and a storage including a plurality of non-volatile memories and a cache memory. The at least one processor may be configured to transmit, in response to booting up of the at least one processor, to the UFS device controller, a first control signal instructing to identify that a measured temperature of the storage is greater than a first threshold value by using a temperature sensor operatively coupled to the UFS device controller or to identifying that the measured temperature of the storage is less than a second threshold value which is less than the first threshold value. The at least one processor may be configured to transmit, in response to receiving, from the UFS device controller, a status signal indicating that the measured temperature of the storage exceeds the first threshold value, to the UFS device controller, a second control signal instructing a plurality of first events to reduce a current consumption of the UFS device controller. The at least one processor may be configured to transmit, in response to receiving, from the UFS device controller, the status signal indicating that the measured temperature of the storage is less than the second threshold value, to the UFS device controller, the second control signal instructing a plurality of second events to increase a current consumption of the UFS device controller.

According to an embodiment, a method of operating the electronic device including at least one processor; a Universal Flash Storage (UFS) device controller operatively coupled with the at least one processor; a UFS interface including a plurality of downstream lanes for transmitting data from the at least one processor to the UFS device controller, and a plurality of upstream lanes for transmitting data from the UFS device controller to the at least one processor; and storage including a plurality of non-volatile memories and a cache memory may include transmitting, in response to booting up of the at least one processor, to the UFS device controller, a first control signal to instruct that measuring a temperature of the storage using a temperature sensor operatively coupled to the UFS device controller, and identifying of the measured temperature exceeding a threshold value; receiving from the UFS device controller, a status signal indicating that the measured temperature of the storage through the temperature sensor exceeds the threshold value; and based on the status signal, transmitting, to the UFS device controller, a second control signal to instruct that deactivating at least some of the plurality of downstream lanes and at least some of the plurality of upstream lanes, and deactivating the cache memory which stores 1 bit per unit cell in the storage. According to an embodiment, a method of operating the electronic device including at least one processor; a Universal Flash Storage (UFS) device controller operatively coupled with the at least one processor; a UFS interface including a plurality of downstream lanes for transmitting data from the at least one processor to the UFS device controller, and a plurality of upstream lanes for transmitting data from the UFS device controller to the at least one processor; and storage including a plurality of non-volatile memories and a cache memory may include transmitting, in response to booting up of the at least one processor, to the UFS device controller, a first control signal instructing to identifying that a measured temperature of the storage is less than a threshold value by using a temperature sensor operatively coupled to the UFS device controller; receiving, from the UFS device controller, a status signal indicating that the measured temperature of the storage through the temperature sensor is less than the threshold value; and based on the status signal, transmit, to the UFS device controller, a second control signal to instruct that activating the deactivated lanes among the plurality of downstream lanes and the plurality of upstream lanes, and activating the cache memory which stores 1 bit per unit cell in the storage.

According to an embodiment, a method of operating the electronic device including at least one processor; a Universal Flash Storage (UFS) device controller operatively coupled with the at least one processor; a UFS interface including a plurality of downstream lanes for transmitting data from the at least one processor to the UFS device controller, and a plurality of upstream lanes for transmitting data from the UFS device controller to the at least one processor; and storage including a plurality of non-volatile memories and a cache memory may include transmitting, in response to booting up of the at least one processor, to the UFS device controller, a first control signal instructing to identifying that a measured temperature of the storage is greater than a first threshold value by using a temperature sensor operatively coupled to the UFS device controller or to identifying that the measured temperature of the storage is less than a second threshold value which is less than the first threshold value; in response to receiving, from the UFS device controller, a status signal indicating that the measured temperature of the storage exceeds the first threshold value, transmitting, to the UFS device controller, a second control signal instructing a plurality of first events to reduce a current consumption of the UFS device controller, and in response to receiving, from the UFS device controller, the status signal indicating that the measured temperature of the storage is less than the second threshold value, transmitting, to the UFS device controller, the second control signal instructing a plurality of second events to increase a current consumption of the UFS device controller.

According to an embodiment, a non-transitory computer readable storage medium may store one or more programs including instructions which, when executed by at least one processor of an electronic device including at least one processor; a Universal Flash Storage (UFS) device controller operatively coupled with the at least one processor; a UFS interface including a plurality of downstream lanes for transmitting data from the at least one processor to the UFS device controller; and a plurality of upstream lanes for transmitting data from the UFS device controller to the at least one processor; and storage including a plurality of non-volatile memories and a cache memory, cause the electronic device to transmit, in response to booting up of the at least one processor, to the UFS device controller, a first control signal to instruct that measuring a temperature of the storage using a temperature sensor operatively coupled to the UFS device controller, and identifying of the measured temperature exceeding a threshold value; receive, from the UFS device controller, a status signal indicating that the measured temperature of the storage through the temperature sensor exceeds the threshold value; and based on the status signal, transmit, to the UFS device controller, a second control signal to instruct that deactivating at least some of the plurality of downstream lanes and at least some of the plurality of upstream lanes, and deactivating the cache memory which stores 1 bit per unit cell in the storage.

According to an embodiment, a non-transitory computer readable storage medium may store one or more programs including instructions which, when executed by at least one processor of an electronic device including at least one processor; a Universal Flash Storage (UFS) device controller operatively coupled with the at least one processor; a UFS interface including a plurality of downstream lanes for transmitting data from the at least one processor to the UFS device controller; and a plurality of upstream lanes for transmitting data from the UFS device controller to the at least one processor; and storage including a plurality of non-volatile memories and a cache memory, cause the electronic device to transmit, in response to booting up of the at least one processor, to the UFS device controller, a first control signal instructing to identifying that a measured temperature of the storage is less than a threshold value by using a temperature sensor operatively coupled to the UFS device controller; receive, from the UFS device controller, a status signal indicating that the measured temperature of the storage through the temperature sensor is less than the threshold value; and based on the status signal, transmit, to the UFS device controller, a second control signal to instruct that activating the deactivated lanes among the plurality of downstream lanes and the plurality of upstream lanes, and activating the cache memory which stores 1 bit per unit cell in the storage.

According to an embodiment, a non-transitory computer readable storage medium may store one or more programs including instructions which, when executed by at least one processor of an electronic device including at least one processor; a Universal Flash Storage (UFS) device controller operatively coupled with the at least one processor; a UFS interface including a plurality of downstream lanes for transmitting data from the at least one processor to the UFS device controller; and a plurality of upstream lanes for transmitting data from the UFS device controller to the at least one processor; and storage including a plurality of non-volatile memories and a cache memory, cause the electronic device to transmit, in response to booting up of the at least one processor, to the UFS device controller, a first control signal instructing to identifying that a measured temperature of the storage is greater than a first threshold value by using a temperature sensor operatively coupled to the UFS device controller or to identifying that the measured temperature of the storage is less than a second threshold value which is less than the first threshold value; in response to receiving, from the UFS device controller, a status signal indicating that the measured temperature of the storage exceeds the first threshold value, transmitting, to the UFS device controller, a second control signal instructing a plurality of first events to reduce a current consumption of the UFS device controller; and in response to receiving, from the UFS device controller, the status signal indicating that the measured temperature of the storage is less than the second threshold value, transmit, to the UFS device controller, the second control signal instructing a plurality of second events to increase a current consumption of the UFS device controller.

According to one embodiment, the Universal Flash Storage (UFS) card may include the UFS device controller, a UFS interface including a downstream lane for receiving data from an external device operatively coupled to the UFS card through the UFS device controller and an upstream lane for transmitting data from the UFS device controller to the external device and storage including multiple non-volatile memories and cache memories; where The UFS device controller may be configured to receive a first control signal from the external device instructing to identify whether the temperature of the storage measured using a temperature sensor operatively coupled to the UFS device controller exceeds a threshold value, transmit the status signal to the external device to indicate that the temperature of the storage exceeds the threshold, receive second control signal instructing the external device to deactivate at least some of the plurality of downstream lanes and at least some of the plurality of upstream lanes and deactivate a cache memory configured to store 1 bit per unit cell of the storage.

According to an embodiment, a System on Chip may include at least one processor, storage controllers that control storage, a UFS interface including downstream lanes and upstream lanes; where the at least one processor may be configured to transmit, in response to booting up of the at least one processor, a first control signal to instruct that measure the temperature of the storage using a temperature sensor operatively coupled to the storage controller and identify that the measured temperature exceeds the threshold, receive a status signal indicating that the temperature measured through the temperature sensor exceeds the threshold From the storage controllers, based on the status signal, through the storage controller, transmit a second control signal instructing the storage controller to deactivate at least some of the downstream lanes and at least some of the upstream lanes and deactivate the cache memory configured to store 1 bit per unit cell of the storage.

According to an embodiment, an electronic device may include at least one processor, a UFS host controller operatively coupled with at least one of the processor, a UFS interface including downstream lanes for transmitting data from the UFS host controller to the UFS device controller and upstream lanes for transmitting data from the UFS device controller to the UFS host controller, and a storage including multiple non-volatile memories and cache memories; where at least one processor may be configured to transmit a first control signal through the UFS host controller instructing the UFS device controller to measure the temperature of the storage using a temperature sensor operatively coupled to the storage in response to booting up of the at least one processor, receive a status signal from the UFS device controller instructing that the measured temperature of the storage exceeds a threshold, and reduce a size of data written to the plurality of non-volatile memories based on the status signal.

The electronic device according to various embodiments disclosed in the present document may be various types of devices. The electronic device may include, for example, a portable communication device (e.g., a smartphone), a computer device, a portable multimedia device, a portable medical device, a camera, a wearable device, or a home appliance. The electronic device according to an embodiment of the present document is not limited to the above-described devices. The various embodiments and terms used herein are not intended to limit the technical features described herein to specific embodiments and should be understood to include various modifications, equivalents, or substitutes of the embodiment. With respect to the description of the drawings, similar reference numerals may be used for similar or related components. The singular form of the noun corresponding to the item may include one or more of the items unless clearly indicated differently in a related context. In this document, each of the phrases such as "A or B", "at least one of A and B", "at least one of A, B and C", "at least one of A, B, or C", and "at least one of A, B, or C" may include any one of the phrases together, or all possible combinations thereof. Terms such as "the first", "the second", or "first", or "second" may be used simply to distinguish a corresponding component from another corresponding component, and are not limited to other aspects (e.g., importance or order). When some (e.g., the first) component is referred to as "coupled" or "connected" in another (e.g., the second) component, with or without the term "functional" or "communicatively", it means that some of the components can be connected directly (e.g., wired), wirelessly, or through a third component.

The term "module" used in various embodiments of the present document may include a unit implemented in hardware, software, or firmware and be used interchangeably with terms such as logic, logic block, component, or circuitry, for example. The module may be a minimum unit or a part of the integrally configured component or the component that performs one or more functions. For example, according to an embodiment, the module may be implemented in the form of an application-specific integrated circuit (ASIC).

Various embodiments of the present document may be implemented as software (e.g., program 140) including one or more instructions stored in a storage medium (e.g., internal memory 136 or external memory 138) readable by a machine (e.g., electronic device 101). For example, the processor (e.g., processor 120) of the device (e.g., electronic device 101) may invoke and execute at least one command of one or more instructions stored from the storage medium. This makes it possible for the device to be operated to perform at least one function according to the at least one called instruction. The one or more instructions may include code generated by a compiler or code that may be executed by an interpreter. The device-readable storage medium may be provided in the form of a non-transitory storage medium. Herein, 'non-transitory' only means that the storage medium is a device that is tangible and does not include a signal (e.g., electromagnetic waves), and the term does not distinguish between when data is stored semi-permanently in the storage medium and temporarily.

According to an embodiment, a method according to various embodiments disclosed in the present document may be provided by being included in a computer program product. The computer program products may be traded between sellers and buyers as products. The computer program products may be distributed in the form of device-readable storage media (e.g., compact disc read only memory (CD-ROM), or distributed (e.g., downloaded or uploaded) directly or online through an application store (e.g., Play Store™) or between two user devices (e.g., smartphones). In the case of online distribution, at least some of the computer program products may be temporarily stored or temporarily created on a device-readable storage medium such as a manufacturer's server, a server in an application store, or a memory in a relay server.

According to various embodiments, each of the above-described components (e.g., a module or a program) may include a single object or a plurality of objects, and some of the plurality of objects may be separated and disposed in other components. According to various embodiments, one or more components or operations of the above-described corresponding components may be omitted, or one or more other components or operations may be added. Alternatively, or additionally, a plurality of components (e.g., modules or programs) may be integrated into one component. In this case, the integrated component may perform one or more functions of each of the components in the same or similar manner as those performed by the corresponding component among the plurality of components before the integration. According to various embodiments, operations performed by a module, a program, or other components may be executed sequentially, in parallel, repeatedly, or heuristic, performed in a different order, omitted, or one or more other operations may be added.

What is claimed is:

1. An electronic device, comprising:
   a processor comprising processing circuitry,
   a Universal Flash Storage (UFS) device including:
   a controller comprising circuitry; and
   non-volatile memories comprising storage mediums, and
   a UFS interface including a plurality of lanes,
   wherein the processor is configured to:
   in response to booting up of the processor, transmit, to the controller, a first control signal to instruct alerting a temperature of the UFS device exceeding a threshold temperature,
   wherein the controller is configured to:
   receive, from the processor, the first control signal;
   based on the first control signal, identify whether the temperature of the UFS device exceeds the threshold temperature; and
   based on that the temperature of the UFS device exceeds the threshold temperature, transmit, to the processor, a status signal, and
   wherein the processor is configured to:
   receive, from the controller, the status signal; and
   transmit, to the controller, a second control signal to cause the controller to deactivate a part of the plurality of lanes.

2. The electronic device of claim 1, wherein the processor is configured to, based on the status signal, transmit, to the controller, the second control signal for changing a delay time, from a first time to a second time which is shorter than the first time, wherein the delay time is a length of a waiting time before the UFS device enters a sleep mode.

3. The electronic device of claim 1, wherein the processor is configured to, based on the status signal, transmit, to the controller, the second control signal instructing to halt tasks running in a background of the controller.

4. The electronic device of claim 1, wherein the processor is configured to, based on the status signal, transmit, to the controller, the second control signal instructing to change an operating frequency of the controller, from a first frequency to a second frequency which is lower than the first frequency, and
wherein the second frequency is varied based on a size of transmitting and receiving bandwidth between the UFS device and the processor.

5. The electronic device of claim 1, wherein the processor is configured to transmit the first control signal including a preset attribute to instruct the alert.

6. The electronic device of claim 1, wherein the electronic device further comprises a dynamic random access memory (DRAM), and
wherein the processor is configured to transmit, to the controller, the second control signal instructing to bypass programming at least a portion of data stored in the DRAM into the non-volatile memories or bypass requesting a read operation of at least a portion of data stored in the non-volatile memories to perform write operation of the at least a portion of the data stored in the non-volatile memories into the DRAM.

7. The electronic device of claim 1, wherein the processor is configured to:
request the controller to transmit the status signal to the processor every predefined period, and
in response to identifying that the temperature of the UFS device is less than the threshold value based on the status signal, transmit, to the controller, a third control signal instructing to activate the deactivated at least part of the plurality of lanes including a plurality of downstream lanes and a plurality of upstream lanes, and to activate a cache memory that is deactivated based on the second control signal.

8. A method of an electronic device, wherein the electronic device comprises a processor comprising processing circuitry, a Universal Flash Storage (UFS) device including a controller comprising circuitry and non-volatile memories comprising storage mediums, and a UFS interface including a plurality of lanes, comprising:
transmitting, in response to booting up of the processor, from the processor to the controller, a first control signal to instruct alerting a temperature of the UFS device exceeding a threshold temperature,
based on receiving the first control signal, identifying whether the temperature of the UFS device exceeds the threshold temperature,
based on that the temperature of the UFS device exceeds the threshold temperature, transmitting, from the UFS device to the processor, a status signal,
based on receiving the status signal, transmitting, from the processor to the controller, a second control signal to cause the controller to deactivate a part of the plurality of lanes.

9. The method of claim 8, wherein the transmitting the second control signal comprises, transmitting, based on the status signal, to the controller, the second control signal for changing a delay time, from a first time to a second time which is longer than the first time, wherein the delay time is a length of a waiting time before the UFS device enters a sleep mode.

10. The method of claim 8, wherein the transmitting the second control signal comprises, transmitting, based on the status signal, to the controller, the second control signal instructing to execute tasks which is running in a background of the controller.

11. The method of claim 8, wherein the transmitting the second signal comprises, transmitting, based on the status signal, to the controller, the second control signal instructing to change the operating frequency of the controller, from a first frequency to a second frequency higher than the first frequency, and
wherein the second frequency is varied based on a size of a transmitting and receiving bandwidth between the controller and the processor.

12. The method of claim 8, wherein the transmitting the first control signal further comprises,
transmitting the first control signal including a preset attribute to instruct the alert.

13. The method of claim 8, wherein the electronic device further comprises a dynamic random access memory (DRAM), and
wherein the transmitting the second control signal comprises, transmitting, to the controller, the second signal instructing to increase a size of data for programming at least a portion of the data stored in the DRAM into the non-volatile memories or to increase a size of data for requesting a read operation of at least a portion of data stored in the non-volatile memories to perform write operation of the at least a portion of the data stored in the non-volatile memories into the DRAM.

14. The method of claim 8, further comprises:
requesting the controller to transmit the status signal to the at least one processor every predefined period, and
transmitting, in response to identifying that the temperature of the UFS device is greater than the threshold value based on the status signal, to the controller, a third control signal instructing to deactivate the activated at least part of the plurality of lanes including a downstream lanes and a plurality upstream lanes, and to deactivate a cache memory that is deactivated based on the second control signal.

15. An electronic device, comprising:
a processor comprising processing circuitry,
a universal flash storage (UFS) device including:
a controller comprising circuitry; and
non-volatile memories comprising storage mediums, and
a UFS interface including a plurality of lanes,
wherein the processor is configured to:
in response to booting up of the processor, transmit, to the controller, a first control signal to instruct alerting that a temperature of the UFS device is greater than a first threshold temperature or less than a second threshold temperature which is less than the first threshold temperature,
in response to receiving, from the controller, a status signal indicating that the temperature of the UFS device is greater than the first threshold temperature, transmit, to the controller, a second control signal to cause the controller to deactivate a part of the plurality of lanes, and
in response to receiving, from the controller, the status signal indicating that the temperature of the UFS device is less than the second threshold temperature, transmit, to the controller, a third control signal to cause the controller to activate a part of the plurality of lanes.

16. The electronic device of claim 15, wherein the second control signal is transmitted to cause the controller a plurality of first events which includes at least one of an instruction deactivating at least part of the plurality lanes, an instruction deactivating a cache memory of the UFS device which stores 1 bit per unit cell in the storage, an instruction changing a delay time, from a first time to a second time which is shorter than the first time, the delay time being a length of a waiting time before the storage enters a sleep mode, an instruction instructing to halt tasks running in a background of the controller, and an instruction changing an operating frequency of the controller, from a first frequency to a second frequency which is lower than the first frequency.

17. The electronic device of claim 16, wherein the processor is configured to:
   request the controller to transmit the status signal to the processor every predefined period, and
   in response to identifying that the temperature of the UFS device is less than the first threshold temperature based on the status signal, transmit, to the controller, a fourth control signal instructing to activate the deactivated at least part of the plurality of lanes, and to activate the deactivated cache memory.

18. The electronic device of claim 15, wherein the third control signal is transmitted to cause the controller a plurality of second events which includes at least one of an instruction activating at least part of deactivated lanes of the plurality of lanes, an instruction activating a cache memory of the UFS device which stores 1 bit per unit cell in the storage, an instruction changing a delay time, from a first time to a second time which is longer than the first time, the delay time being a length of a waiting time before the storage enters a sleep mode, an instruction executing tasks which is running in a background of the controller, an instruction changing the operating frequency of the controller, from a first frequency to a second frequency lower than the first frequency.

19. The electronic device of claim 18, wherein the processor is configured to:
   request the controller to transmit the status signal to the at least one processor every predefined period, and
   in response to identifying that the temperature of the UFS device is greater than the second threshold value based on the status signal, transmit, to the controller, a fourth control signal instructing to deactivate at least part of the activated plurality of lanes, and to deactivate the activated cache memory.

20. The electronic device of claim 15, wherein the plurality of lanes include a plurality of downstream lanes for transmitting data from the processor to the controller, and a plurality of upstream lanes for transmitting data from the controller to the processor.

* * * * *